United States Patent
Yang et al.

(10) Patent No.: US 11,515,449 B2
(45) Date of Patent: Nov. 29, 2022

(54) SEMICONDUCTOR LIGHT EMITTING DEVICE AND METHOD OF FABRICATING THE SAME

(71) Applicant: SAMSUNG ELECTRONICS CO., LTD., Suwon-si (KR)

(72) Inventors: Jongin Yang, Hwaseong-si (KR); Yongil Kim, Seoul (KR); Juhyun Kim, Seoul (KR); Tan Sakong, Seoul (KR); Jonguk Seo, Hwaseong-si (KR); Suhyun Jo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 12 days.

(21) Appl. No.: 16/935,356

(22) Filed: Jul. 22, 2020

(65) Prior Publication Data
US 2021/0159365 A1  May 27, 2021

(30) Foreign Application Priority Data
Nov. 21, 2019  (KR) .................. 10-2019-0150455

(51) Int. Cl.
*H01L 33/38* (2010.01)
*H01L 33/62* (2010.01)

(52) U.S. Cl.
CPC ............ *H01L 33/387* (2013.01); *H01L 33/62* (2013.01); *H01L 2933/0016* (2013.01)

(58) Field of Classification Search
CPC .................. H01L 33/387; H01L 33/62; H01L 2933/0016; H01L 33/382; H01L 33/385; H01L 33/56; H01L 33/58; H01L 33/60
See application file for complete search history.

(56) References Cited

U.S. PATENT DOCUMENTS

| | | | |
|---|---|---|---|
| 8,471,288 B2 | 6/2013 | Uemura et al. | |
| 8,502,193 B2 | 8/2013 | Song | |
| 9,293,664 B2 | 3/2016 | Seo et al. | |

(Continued)

FOREIGN PATENT DOCUMENTS

| | | |
|---|---|---|
| KR | 1020150089769 A | 8/2015 |
| KR | 101773582 B1 | 8/2017 |

(Continued)

*Primary Examiner* — Latanya N Crawford Eason
(74) *Attorney, Agent, or Firm* — Sughrue Mion, PLLC

(57) ABSTRACT

Semiconductor light emitting devices and methods of fabricating the same are provided. The semiconductor light emitting device includes a light emitting structure, a first electrode, a first dielectric layer, a second electrode, and a vertical conductive pattern. The light emitting structure includes a first semiconductor layer, an active layer, and a second semiconductor layer that are sequentially stacked, and includes a first opening that penetrates the second semiconductor layer and the active layer, the first opening exposing the first semiconductor layer. The first electrode fills at least a portion of the first opening. The first dielectric layer is on the first electrode. The second electrode is on the light emitting structure and covers the first dielectric layer, the second electrode being electrically connected to the second semiconductor layer. The vertical conductive pattern surrounds outer lateral surfaces of the light emitting structure and is electrically connected to the first electrode.

19 Claims, 36 Drawing Sheets

(56) References Cited

U.S. PATENT DOCUMENTS

| | | |
|---|---|---|
| 9,299,742 B2 | 3/2016 | Schubert |
| 9,680,063 B2 | 6/2017 | Miyachi et al. |
| 2016/0268478 A1* | 9/2016 | Tomizawa .............. H01L 33/42 |
| 2016/0276539 A1* | 9/2016 | Kaga ....................... H01L 33/44 |
| 2016/0351751 A1* | 12/2016 | Chen ..................... H01L 33/405 |
| 2017/0040515 A1* | 2/2017 | Lee ....................... H01L 33/382 |
| 2018/0047780 A1* | 2/2018 | Yeon ...................... H01L 33/50 |
| 2020/0020739 A1* | 1/2020 | Chen ..................... H01L 27/156 |

FOREIGN PATENT DOCUMENTS

| | | |
|---|---|---|
| KR | 101780893 B1 | 9/2017 |
| KR | 101861632 B1 | 5/2018 |

* cited by examiner

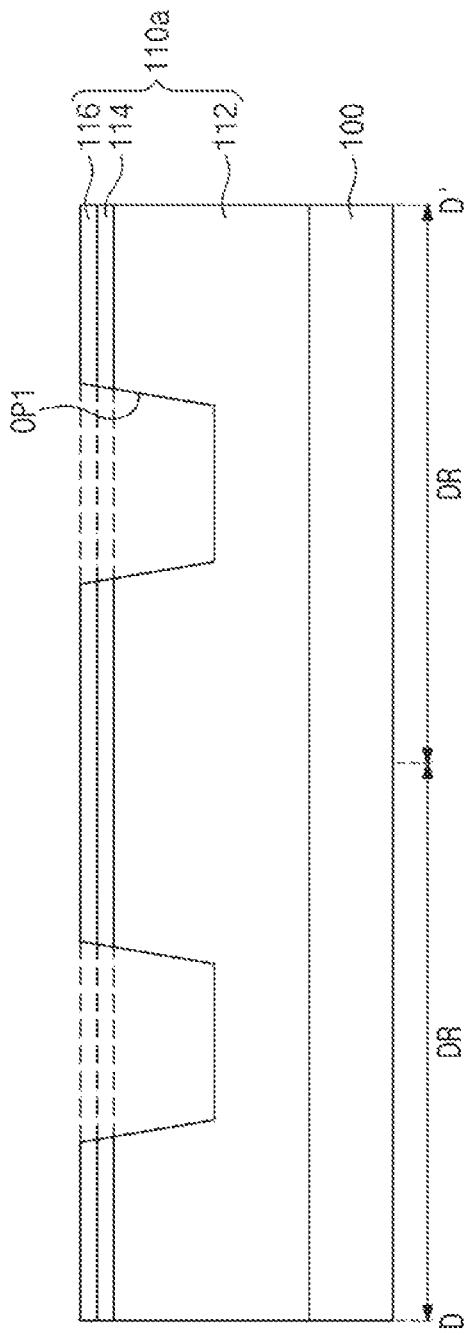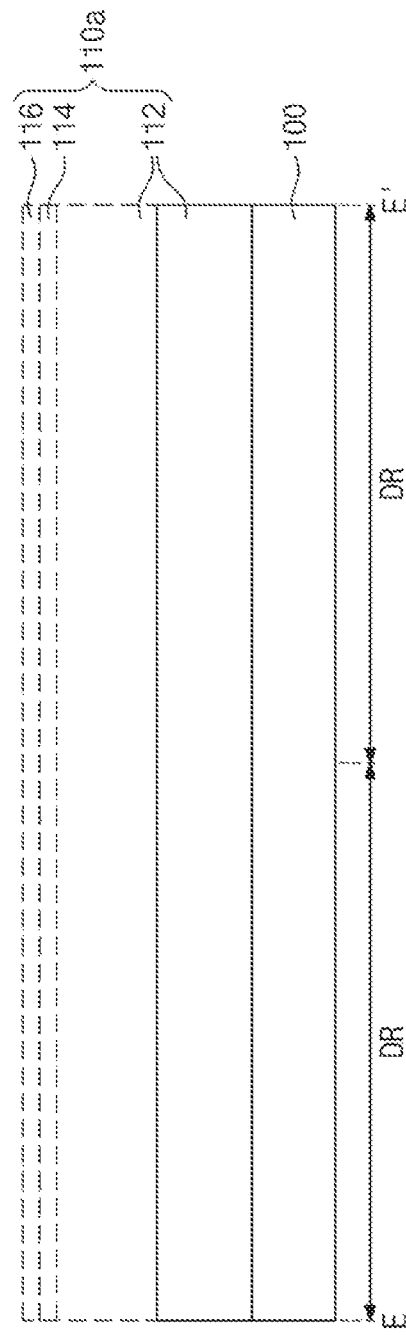

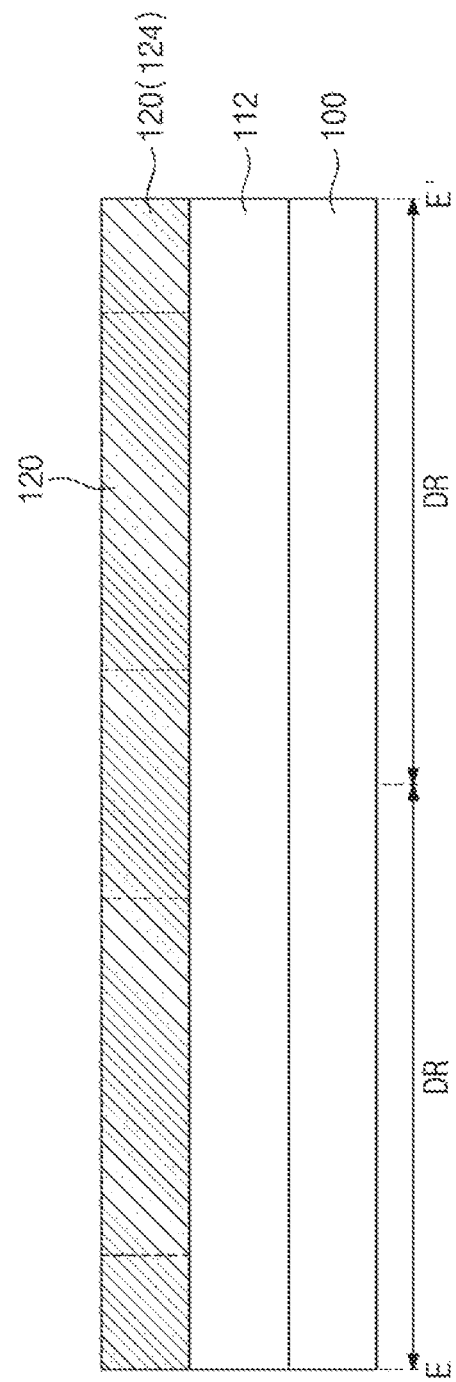

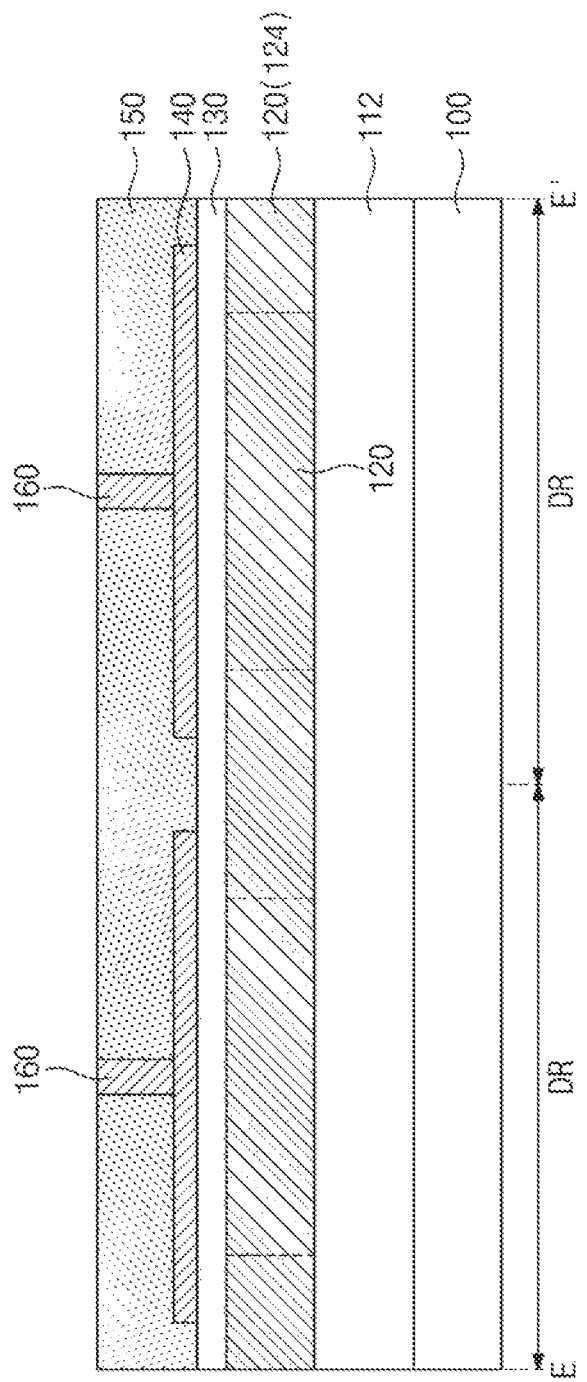

SEMICONDUCTOR LIGHT EMITTING DEVICE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2019-0150455 filed on Nov. 21, 2019, in the Korean Intellectual Property Office, the disclosure of which is hereby incorporated by reference in its entirety.

BACKGROUND

1. Field

Apparatuses, devices, and methods consistent with the present disclosure relate to a semiconductor light emitting device and a method of fabricating the same.

2. Description of Related Art

Semiconductor light emitting devices, such as light emitting diodes (LED), are apparatuses in which light is released from materials included therein. Light emitting devices emit light converted from energy generated from recombination of electrons and holes contained in combined semiconductors. Such light emitting diodes (LED) are currently in widespread use as illumination, display devices, and light sources, and development thereof have been accelerated.

In particular, general illumination has recently been actively studied due to the development and commercially widespread use of mobile phone keypads, turn signal lamps, and camera flashes, which use GaN-based light emitting diodes. Its applications such as backlight units of large-sized TVs, automotive headlights, general lightings have moved from small portable products to larger, high powered, and more efficient products, which trend requires light sources that have necessary characteristics for such appliances.

SUMMARY

It is an aspect to provide a compact-sized semiconductor light emitting device and a method of fabricating the same.

It is another aspect to provide a semiconductor light emitting device with increased electrical characteristics and a method of fabricating the same.

Aspects are not limited to the mentioned above, and other aspects which have not been mentioned above will be clearly understood to those skilled in the art from the following description.

According to an aspect of an example embodiment, there is provided a semiconductor light emitting device comprising a light emitting structure that includes a first semiconductor layer, an active layer, and a second semiconductor layer that are sequentially stacked, and that includes a first opening that penetrates the second semiconductor layer and the active layer, the first opening exposing the first semiconductor layer; a first electrode that fills at least a portion of the first opening; a first dielectric layer on the first electrode; a second electrode on the light emitting structure and covering the first dielectric layer, the second electrode being electrically connected to the second semiconductor layer; and a vertical conductive pattern that surrounds outer lateral surfaces of the light emitting structure and is electrically connected to the first electrode.

According to another aspect of an example embodiment, there is provided a semiconductor light emitting device comprising a light emitting structure that includes a first semiconductor layer, an active layer, and a second semiconductor layer that are sequentially stacked; a first opening that penetrates the second semiconductor layer and the active layer, the first opening exposing the first semiconductor layer; a first electrode that partially fills the first opening and contacts the first semiconductor layer exposed by the first opening; a second electrode that covers the second semiconductor layer and the first electrode; and a first dielectric layer between the first electrode and the second electrode.

According to yet another aspect of an example embodiment, there is provided a method of fabricating a semiconductor light emitting device, the method comprising sequentially stacking a first semiconductor layer, an active layer, and a second semiconductor layer to form a light emitting structure on a growth substrate; removing a portion of the light emitting structure that is spaced apart from outer lateral surfaces of the light emitting structure to form an opening that exposes the first semiconductor layer; filling a lower portion of the opening with a conductive material to form a first electrode; filling a remaining portion of the opening with a dielectric material to form a first dielectric layer; and coating a conductive material on the second semiconductor layer and the first dielectric layer to form a second electrode.

BRIEF DESCRIPTION OF THE DRAWINGS

Example embodiments will be better understood from the following description with reference to the drawings, in which:

FIGS. 11A to 23A and 11B to 23B illustrate cross-sectional views showing a method of fabricating a semiconductor light emitting device array according to some example embodiments;

DETAILED DESCRIPTION

The following will now describe a semiconductor light emitting device according to various example embodiments with reference to the accompanying drawings.

Figure 1:
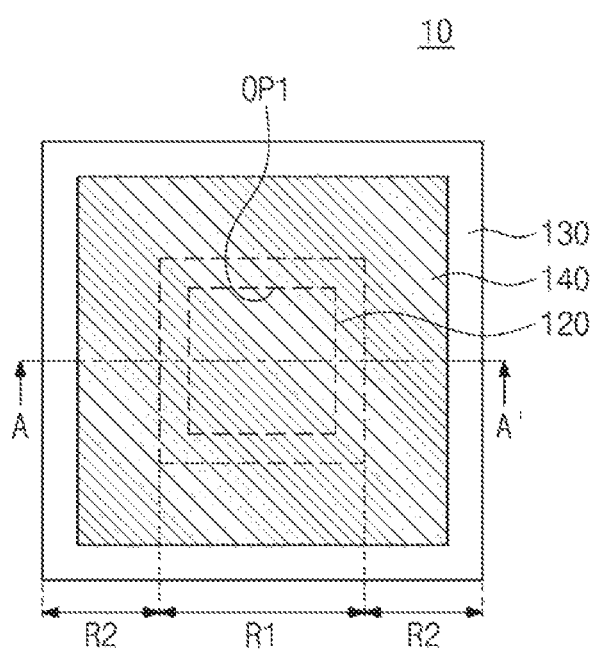
FIG. 1 illustrates a plan view showing a semiconductor light emitting device according to some example embodiments.
Figure 2A:
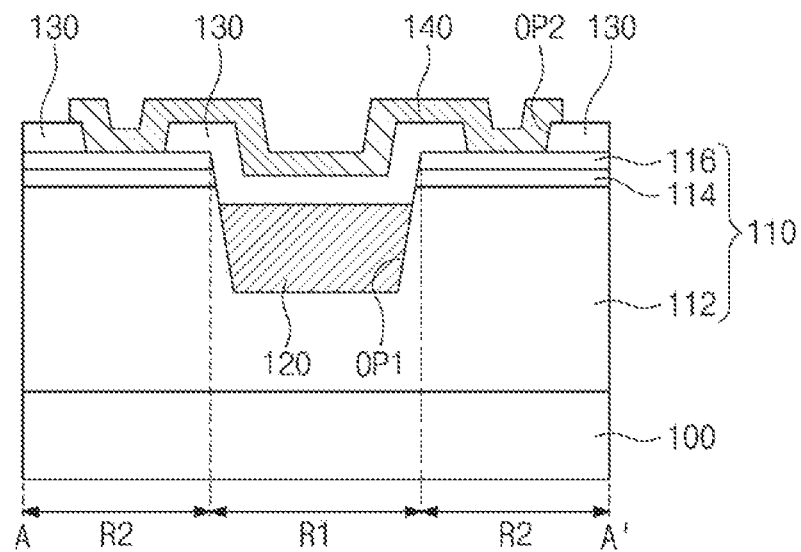
FIGS. 2A and 2B illustrate cross-sectional views showing a semiconductor light emitting device according to some example embodiments.
Figure 2B:
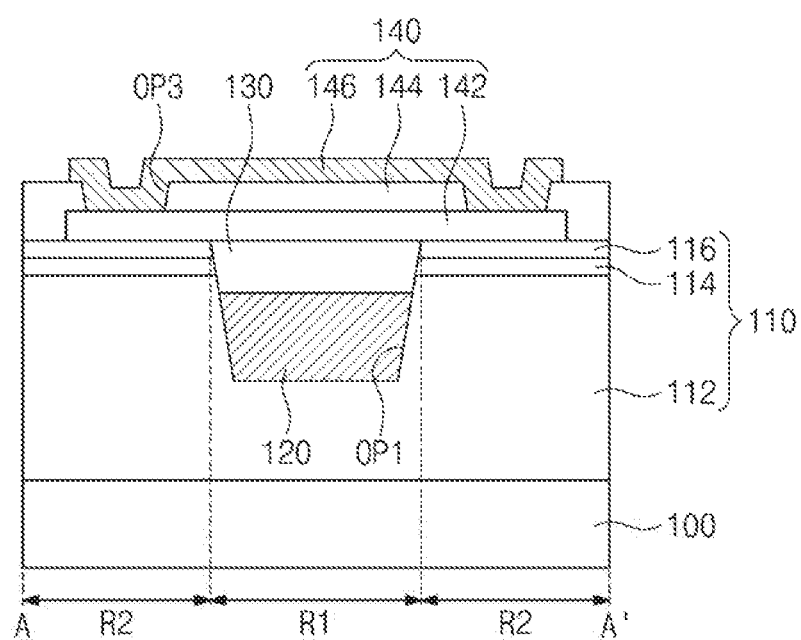
Figure 3:
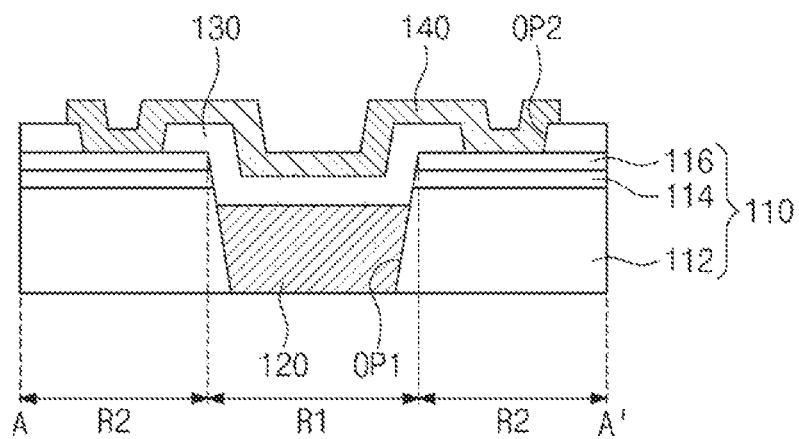
FIGS. 3 and 4 illustrate cross-sectional views showing a semiconductor light emitting device according to some example embodiments.
Figure 4:
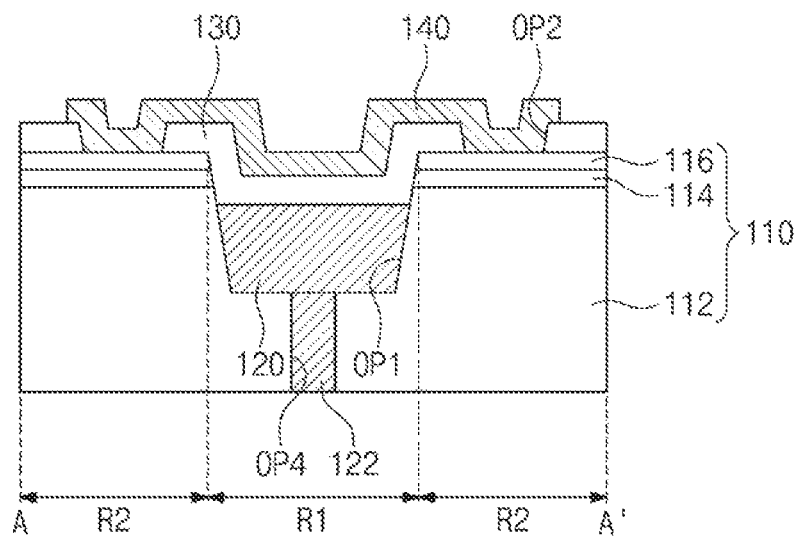

FIG. 1 illustrates a plan view showing a semiconductor light emitting device according to some example embodiments. FIGS. 2A and 2B illustrate cross-sectional views taken along line A-A' of FIG. 1, showing a semiconductor light emitting device according to some example embodiments. FIGS. 3 and 4 illustrate cross-sectional views showing a semiconductor light emitting device according to some example embodiments.

Referring to FIGS. 1 and 2A, a semiconductor light emitting device 10 may include a growth substrate 100 and a light emitting structure 110 that includes a first semiconductor layer 112, an active layer 114, and a second semiconductor layer 116 that are sequentially stacked on the growth substrate 100. A buffer layer (not shown) may be interposed between the growth substrate 100 and the first semiconductor layer 112. The buffer layer (not shown) may be provided to alleviate a lattice mismatch between the growth substrate 100 and the first semiconductor layer 112. In some example embodiments, the growth substrate 100 may be a transparent substrate, such as a sapphire substrate. Alternatively, in other example embodiments, the growth substrate 100 may be an opaque substrate, such as a silicon (Si) substrate.

The first semiconductor layer 112 may include a semiconductor doped with n-type impurities. For example, the first semiconductor layer 112 may be an n-type semiconductor nitride layer. The second semiconductor layer 116 may include a semiconductor doped with p-type impurities. For example, the second semiconductor layer 116 may be a p-type semiconductor nitride layer. The first and second semiconductor layers 112 and 116 may have a composition of $Al_xIn_yGa_{(1-x-y)}N$ (where, $0 \le x \le 1$, $0 \le y \le 1$, $0 \le x+y \le 1$). For example, the first and second semiconductor layers 112 and 116 may include GaN, AlGaN, InGaN, or AlInGaN. In this case, the n-type impurities may include silicon (Si), and the p-type impurities may include magnesium (Mg).

The active layer 114 may be disposed between the first and second semiconductor layers 112 and 116, and may discharge light whose energy is generated by recombination of electron-hole. The active layer 114 may include a material whose energy bandgap is less than that of materials of the first and second semiconductor layers 112 and 116. For example, when the first and second semiconductor layers 112 and 116 include a GaN-based compound semiconductor, the active layer 114 may include an InGaN-based compound semiconductor whose energy bandgap is less than that of GaN. The active layer 114 may have a multiple quantum well (MQW) structure, such as a structure of InGaN/GaN, in which at least one quantum well layer and at least one quantum barrier layer are alternately stacked. The present inventive concepts, however, are not limited thereto. For another example, the active layer 114 may have a single quantum well (SQW) structure.

The light emitting structure 110 may include a first region R1 and a second region R2. The first region R1 may correspond to an area where the second semiconductor layer 116 and the active layer 114 are etched to expose a top surface of the first semiconductor layer 112. The second region R2 may correspond to an area of the light emitting structure 110, which area is not etched during the formation of the first region R1. When viewed in plan, the second region R2 may surround the first region R1 as illustrated in FIG. 1.

The light emitting structure 110 may have a first opening OP1. The first opening OP1 may be provided on the first region R1. The first opening OP1 may penetrate the second semiconductor layer 116 and the active layer 114 of the light emitting structure 110, and may expose the top surface of the first semiconductor layer 112. The first opening OP1 may be used as a connection path through which the first semiconductor layer 112 is coupled to a first electrode 120 which will be discussed below.

In some example embodiments, the first opening OP1 may have a tetragonal shape when viewed in plan as illustrated in FIG. 1, but example embodiments are not limited thereto. In other example embodiments, the first opening OP1 may have a circular or polygonal shape when viewed in plan. As shown in FIG. 2A, the first opening OP1 may have a width that gradually decreases as approaching the growth substrate 100. In other words, the width of the first opening OP1 may gradually decrease as a distance from the growth substrate 100 decreases. The first opening OP1 may have a minimum width less than about 10 μm. For example, the minimum width of the first opening OP1 may range from about 0.1 μm to about 10 μm. A distance of about 1 μm to about 100 μm may be provided between an inner lateral surface of the first opening OP1 and an outer lateral surface of the light emitting structure 110.

A first electrode 120 may be disposed in the first opening OP1. The first electrode 120 may fill a lower portion of the first opening OP1. The first electrode 120 may be in contact with bottom and inner lateral surfaces of the first opening OP1. For example, the first electrode 120 may be in contact with top and lateral surfaces of the first semiconductor layer 112 that are exposed to the first opening OP1. The first electrode 120 and the top and lateral surfaces of the first semiconductor layer 112 that are exposed to the first opening OP1 may be in contact with each other to form an n-contact. In other words, the n-contact may extend down one side surface of the first opening OP1 across the bottom of the first opening OP1 and up the other side surface of the first opening OP1. The first electrode 120 may be electrically connected through the n-contact to the first semiconductor layer 112. The first electrode 120 may have a top surface at a lower level than that of a bottom surface of the active layer 114. Therefore, the first electrode 120 may be spaced apart and electrically insulated from the active layer 114 and the second semiconductor layer 116. The first electrode 120 may include a conductive material. For example, the conductive material may include either metal such as copper (Cu), aluminum (Al), and silver (Ag) or transparent conductive oxide such as indium tin oxide (ITO), indium zinc oxide (IZO), and indium tin zinc oxide (ITZO).

A first dielectric layer 130 may be disposed on the first electrode 120. The first dielectric layer 130 may fill an upper portion of the first opening OP1. The first dielectric layer 130 may extend onto a top surface of the second semiconductor layer 116 on the second region R2. In this configuration, as shown in FIG. 2A, the first dielectric layer 130 may conformally cover the top surface of the second semiconductor layer 116 (except for where a second electrode 140 to be described later is provided), the inner lateral surface of the first opening OP1, and the top surface of the first electrode 120. The first dielectric layer 130 may cover a lateral surface of the active layer 114 exposed to the inner lateral surface of the first opening OP1. In some example embodiments, the first dielectric layer 130 may include a dielectric material, such as silicon oxide or silicon nitride. Alternatively, in other example embodiments, the first dielectric layer 130 may have a structure in which a plurality of layers are alternately and repeatedly stacked, where the plurality of layers that have different refractive indices from each other that are less than a refractive index of the second semiconductor layer 116. For example, one of the plurality of layers may be a silicon oxide ($SiO_2$) layer, and another of the plurality of layers may be a titanium oxide ($TiO_2$) layer or a niobium oxide ($Nb_2O_5$) layer.

In other example embodiments, as shown in FIG. 2B, the first dielectric layer 130 may fill the upper portion of the first opening OP1, but may not extend onto the top surface of the second semiconductor layer 116. The first dielectric layer 130 may have a top surface at a higher level than that of a top surface of the active layer 114. For example, the top surface of the first dielectric layer 130 may be located at the same level as that of the top surface of the second semiconductor layer 116.

Returning to FIG. 2A, the first dielectric layer 130 may have a second opening OP2 that penetrates therethrough and exposes the top surface of the second semiconductor layer 116. The second opening OP2 may be located in the second region R2. The second opening OP2 may be used as a connection path through which the second semiconductor layer 116 is coupled to a second electrode 140 which will be discussed below.

A second electrode 140 may be disposed on the light emitting structure 110. The second electrode 140 may be positioned on the first and second regions R1 and R2. For example, the second electrode 140 may cover the first dielectric layer 130 in the first region R1, and may extend onto the top surface of the second semiconductor layer 116 in the second region R2. In this configuration, the second electrode 140 may overlap an entirety of the first opening OP1 and may have a planar shape larger than that of the first opening OP1. Thus, the second electrode 140 may have a planar shape that is larger than a planar shape of the first electrode 120. The second electrode 140 may have a width greater than a maximum width of the first opening OP1. The second electrode 140 may be coupled to the second semiconductor layer 116 through the second opening OP2 of the first dielectric layer 130. When the first dielectric layer 130 does not extend onto the second semiconductor layer 116, the second electrode 140 may be in direct contact with the top surface of the second semiconductor layer 116 in the second region R2. The second electrode 140 may include a reflective metallic material, such as silver (Ag) or aluminum (A). For example, the second electrode 140 may include silver (Ag).

In other example embodiments, the second electrode 140 may be a multi-layered electrode. For example, as shown in FIG. 2B, the second electrode 140 may include a transparent electrode layer 142, an electrode dielectric layer 144, and a reflective metal layer 146 that are sequentially stacked. The reflective metal layer 146 may be connected to the transparent electrode layer 142 through third openings OP3 formed in the electrode dielectric layer 144. The transparent electrode layer 142 may include a transparent conductive oxide, such as indium tin oxide (ITO), indium zinc oxide (IZO), and indium tin zinc oxide (ITZO). The electrode dielectric layer 144 may include a dielectric material whose refractive index less than that of a dielectric material of the second semiconductor layer 116. In some example embodiments, the electrode dielectric layer 144 may be a single layer of silicon oxide ($SiO_2$). Alternatively, in other example embodiments, the electrode dielectric layer 144 may have a structure in which a plurality of layers are alternately and repeatedly stacked, where refractive indices of the layers are different from each other and less than a refractive index of the second semiconductor layer 116. For example, one of the plurality of layers may be a silicon oxide ($SiO_2$) layer, and another of the plurality of layers may be a titanium oxide ($TiO_2$) layer or a niobium oxide ($Nb_2O_5$) layer. Accordingly, the electrode dielectric layer 144 may have an omnidirectional reflective (ODR) structure or a distributed Bragg reflective (DBR) structure. The reflective metal layer 146 may include a reflective metallic material, such as silver (Ag) or aluminum (Al).

The second electrode 140 may be electrically connected to an external circuit through a conductive line, a solder bump, or a conductive plug provided on the second electrode 140.

Various methods may be utilized to electrically connect an external circuit to the first electrode 120 embedded in the first opening OP1. For example, in some example embodiments as shown in FIG. 3, the growth substrate 100 may be omitted (i.e., the growth substrate 100 may not be provided below the light emitting structure 110), and the first opening OP1 may be formed to penetrate the light emitting structure 110. Therefore, the first electrode 120 may be exposed on a bottom surface of the light emitting structure 110, and may be electrically connected to an external circuit through a conductive line, a solder bump, or a conductive plug provided on an exposed bottom surface of the first electrode 120. Alternatively, in other example embodiments as shown in FIG. 4, the growth substrate 100 may be omitted (i.e., the growth substrate 100 may not be provided below the light emitting structure 110), and the light emitting structure 110 may have a fourth opening OP4 formed in a lower portion thereof. The fourth opening OP4 may be provided in the first region R1. The fourth opening OP4 may vertically overlap the first opening OP1, and may penetrate the first semiconductor layer 112 of the light emitting structure 110 and expose a bottom surface of the first electrode 120. The fourth opening OP4 may have a width less than that of a minimum width of the first opening OP1. A sub-electrode 122 may be disposed in the fourth opening OP4. In the fourth opening OP4, the sub-electrode 122 may be coupled to the first electrode 120. The sub-electrode 122 may be exposed on the bottom surface of the light emitting structure 110, and may be electrically connected to an external circuit through a conductive line, a solder bump, or a conductive plug provided on an exposed bottom surface of the sub-electrode 122. Although several methods for connection to the first electrode 120 are discussed above, example embodiments are not limited thereto.

In the related art, when a first electrode and a second electrode for applying electrical signals to a light emitting structure are provided in different regions (i.e., the first electrode and the second electrode are provided in regions side-by-side), the light emitting structure must have a large area on which the first and second electrodes are disposed.

By contrast, according to various example embodiments, the first and second electrodes 120 and 140, which apply electrical signals to the light emitting structure 110, may vertically overlap each other. Therefore, the first and second electrodes 120 and 140 may be placed in a smaller area, and as a result the semiconductor light emitting device 10 may be easily reduced in size.

In addition, the first electrode 120 may be buried in the first opening OP1 of the light emitting structure 110, and may be in contact with the top and lateral surfaces of the first semiconductor layer 112 exposed to the first opening OP1.

Accordingly, the n-contact may have a large area between the first electrode 120 and the first semiconductor layer 112, and the semiconductor light emitting device 10 may have improved electrical characteristics.

Figure 5:
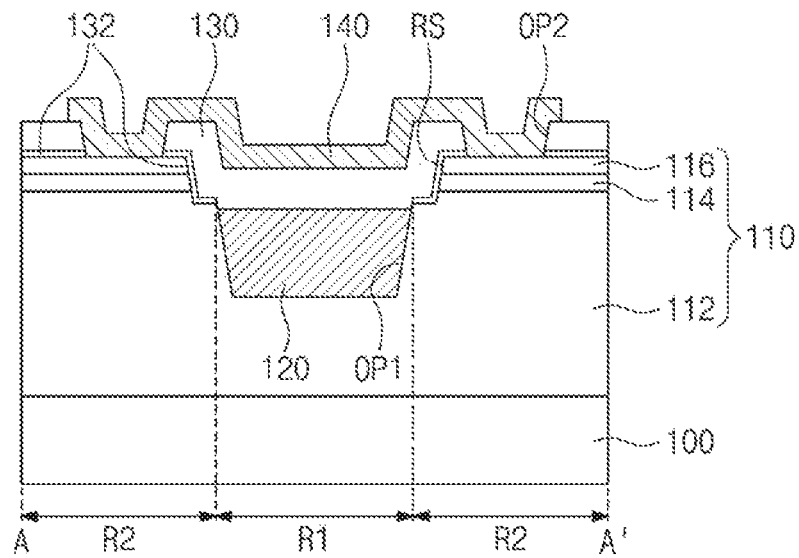
FIGS. 5 and 6 illustrate cross-sectional views showing a semiconductor light emitting device according to some example embodiments.
Figure 6:
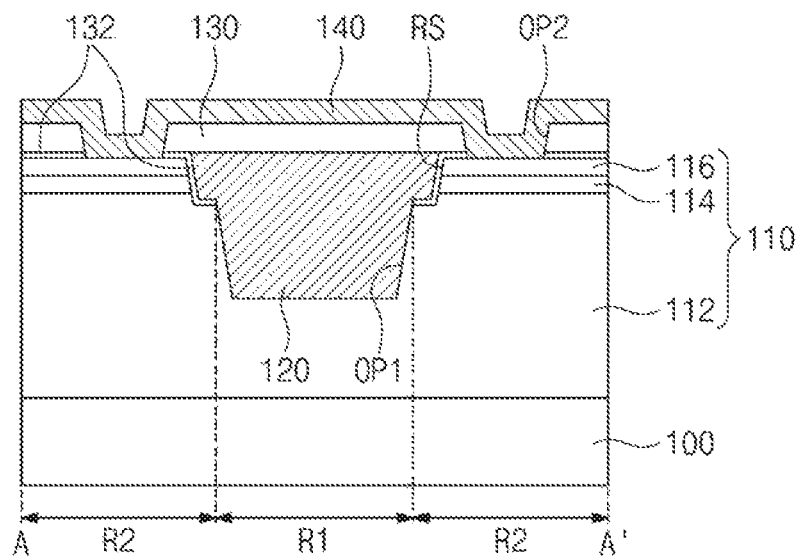

In other example embodiments, the light emitting structure 110 may further have a recess positioned on the first opening OP1. FIGS. 5 and 6 illustrate cross-sectional views showing a semiconductor light emitting device according to some other example embodiments.

Referring to FIG. 5, a recess RS may be provided on the first region R1. The recess RS may penetrate the second semiconductor layer 116 and the active layer 114, and may expose the first semiconductor layer 112. The recess RS may be formed to vertically overlap the entirety of the first opening OP1. The recess RS may have a width greater than that of the first opening OP1, and also have a depth less than that of the first opening OP1. The depth of the recess RS may indicate a distance from the top surface of the second semiconductor layer 116 to a bottom surface of the recess RS, and the depth of the first opening OP1 may denote a distance from the top surface of the second semiconductor layer 116 to a bottom surface of the first opening OP1. In consideration of the shapes of the first opening OP1 and the recess RS, the first opening OP1 may pass through a central portion of the recess RS and extend toward an inside of the first semiconductor layer 112.

The first electrode 120 may fill the lower portion of the first opening OP1, but may not fill the recess RS. The first dielectric layer 130 may fill the recess RS, and may extend onto the top surface of the second semiconductor layer 116 on the second region R2. The second electrode 140 may be disposed on the first dielectric layer 130, and may be in contact with the second semiconductor layer 116 via the second opening OP2 of the first dielectric layer 130.

A second dielectric layer 132 may be interposed between the first dielectric layer 130 and the second semiconductor layer 116. For example, the second dielectric layer 132 may cover the top surface of the second semiconductor layer 116 (except for an area of the second openings OP2) and the bottom and inner lateral surfaces of the recess RS. In this case, the first opening OP1 may be formed to penetrate the second dielectric layer 132 and to expose the first semiconductor layer 112, and the second opening OP2 may be formed to penetrate the second dielectric layer 132 and to expose the second semiconductor layer 116. The second dielectric layer 132 may include a dielectric material, such as silicon oxide or silicon nitride.

In other example embodiments, as shown in FIG. 6, the first electrode 120 may fill both the first opening OP1 and the recess RS. In this case, the top surface of the first electrode 120 may be located at a higher level than that of the bottom surface of the active layer 114. For example, the top surface of the first electrode 120 may be positioned inside the recess RS or located at a higher level than that of the top surface of the second semiconductor layer 116.

The second dielectric layer 132 may be interposed between the first dielectric layer 130 and the second semiconductor layer 116. The second dielectric layer 132 may extend between the first electrode 120 and the inner lateral surface of the recess RS. The second dielectric layer 132 may separate and electrically insulate the first electrode 120 from the active layer 114 and the second semiconductor layer 116.

Figure 7:
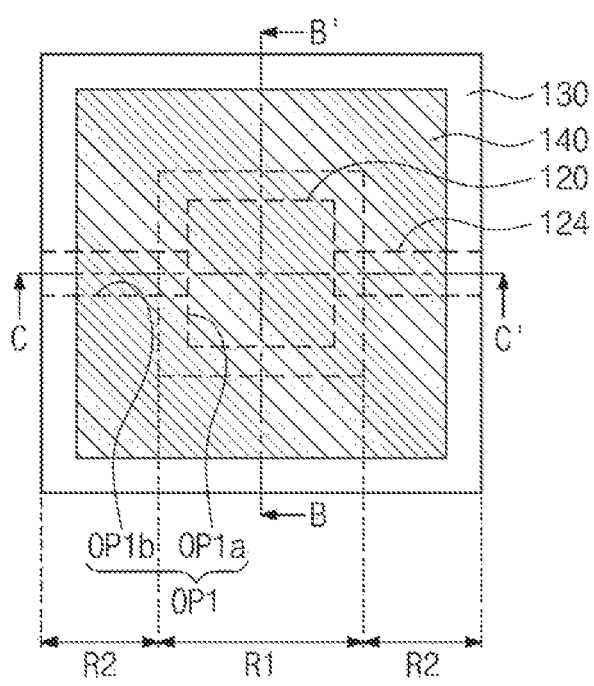
FIG. 7 illustrates a plan view showing a semiconductor light emitting device according to some example embodiments.
Figure 8:
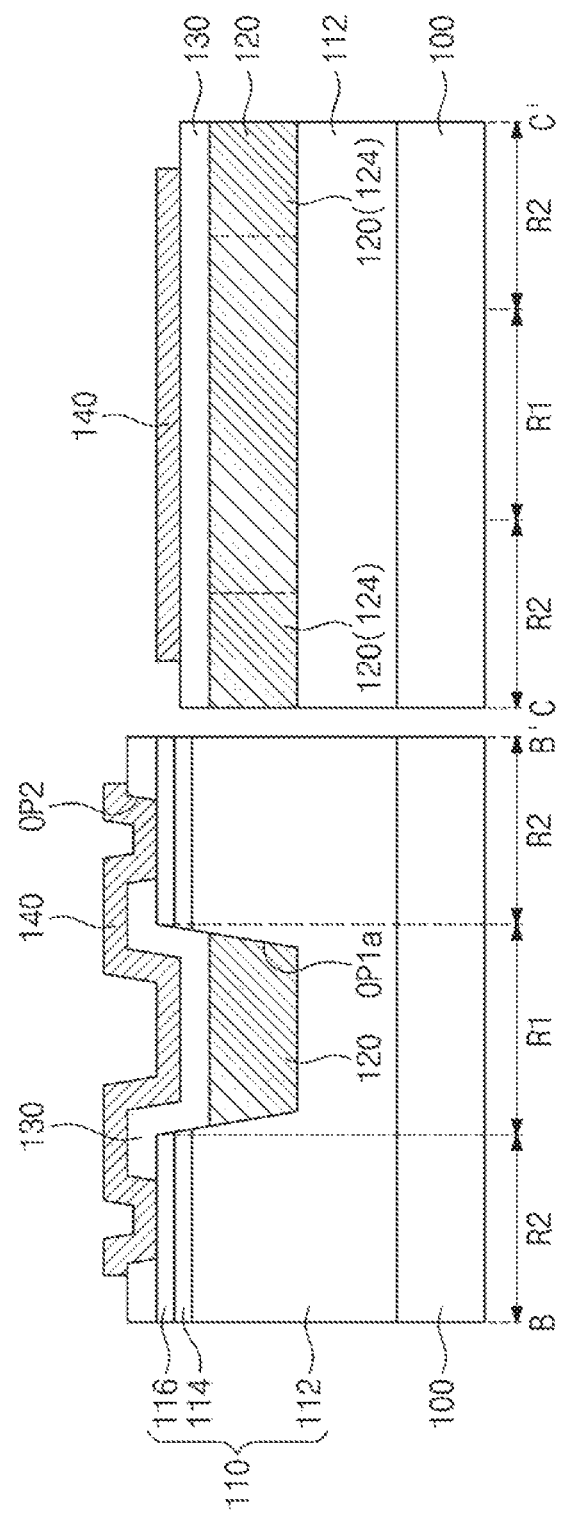
FIG. 8 illustrates a cross-sectional view showing a semiconductor light emitting device according to some example embodiments.

FIG. 7 illustrates a plan view showing a semiconductor light emitting device according to some example embodiments. FIG. 8 illustrates a cross-sectional view taken along lines B-B' and C-C' of FIG. 7, showing a semiconductor light emitting device according to some example embodiments.

Referring to FIGS. 7 and 8, a portion of the first opening OP1 may extend toward at least one of outer lateral surfaces of the light emitting structure 110. For example, the first opening OP1 may include a first segment OP1*a* formed in the first region R1 and a second segment OP1*b* formed in the second region R2. In the example embodiment illustrated in FIGS. 7 and 8, the first segment OP1*a* of the first opening OP1 may be substantially the same as the first opening OP1 discussed with reference to FIGS. 1 to 6. The second segment OP1*b* may connect the first segment OP1*a* to one of the outer lateral surfaces of the light emitting structure 110, as best seen in FIG. 7. FIG. 7 shows that the second segment OP1*b* has a width less than that of the first segment OP1*a*, but example embodiments are not limited thereto.

The first electrode 120 may be disposed in the first segment OP1*a* of the first opening OP1. The first electrode 120 may include an extension portion 124 disposed in the second segment OP1*b* of the first opening OP1. The extension portion 124 may fill a lower portion of the second segment OP1*b*. The extension portion 124 may be in contact with the first semiconductor layer 112 exposed to the second segment OP1*b*. The extension portion 124 and the first semiconductor layer 112 may be in contact with each other to form an n-contact. The extension portion 124 may be electrically connected through the n-contact to the first semiconductor layer 112. The extension portion 124 may have a top surface at a lower level than that of the bottom surface of the active layer 114. Therefore, the extension portion 124 may be spaced apart and electrically insulated from the active layer 114 and the second semiconductor layer 116. The extension portion 124 may extend from a lateral surface of the first electrode 120 toward the outer lateral surface of the light emitting structure 110. The extension portion 124 may be exposed on the outer lateral surface of the light emitting structure 110. The extension portion 124 may have a lateral surface exposed on the outer lateral surface of the light emitting structure 110, and the exposed lateral surface of the extension portion 124 may serve as a pad or terminal through which the first electrode 120 may be electrically connected to an external circuit.

The first dielectric layer 130 may be disposed on the first electrode 120. The first dielectric layer 130 may fill an upper portion of the first segment OP1*a* of the first opening OP1. The first dielectric layer 130 may extend onto the top surface of the extension portion 124 of the first electrode 120. Thus, the first dielectric layer 130 may fill an upper portion of the second segment OP1*b* of the first opening OP1.

The second electrode 140 may be disposed on the light emitting structure 110. The second electrode 140 may be positioned in the first and second regions R1 and R2. For example, the second electrode 140 may cover the first dielectric layer 130 in the first region R1, and may extend onto the top surface of the second semiconductor layer 116 in the second region R2. In this configuration, the second electrode 140 may overlap an entirety of the first segment OP1*a* of the first opening OP1 and may have a planar shape larger than a planar shape of the first segment OP1*a*.

Figure 9:
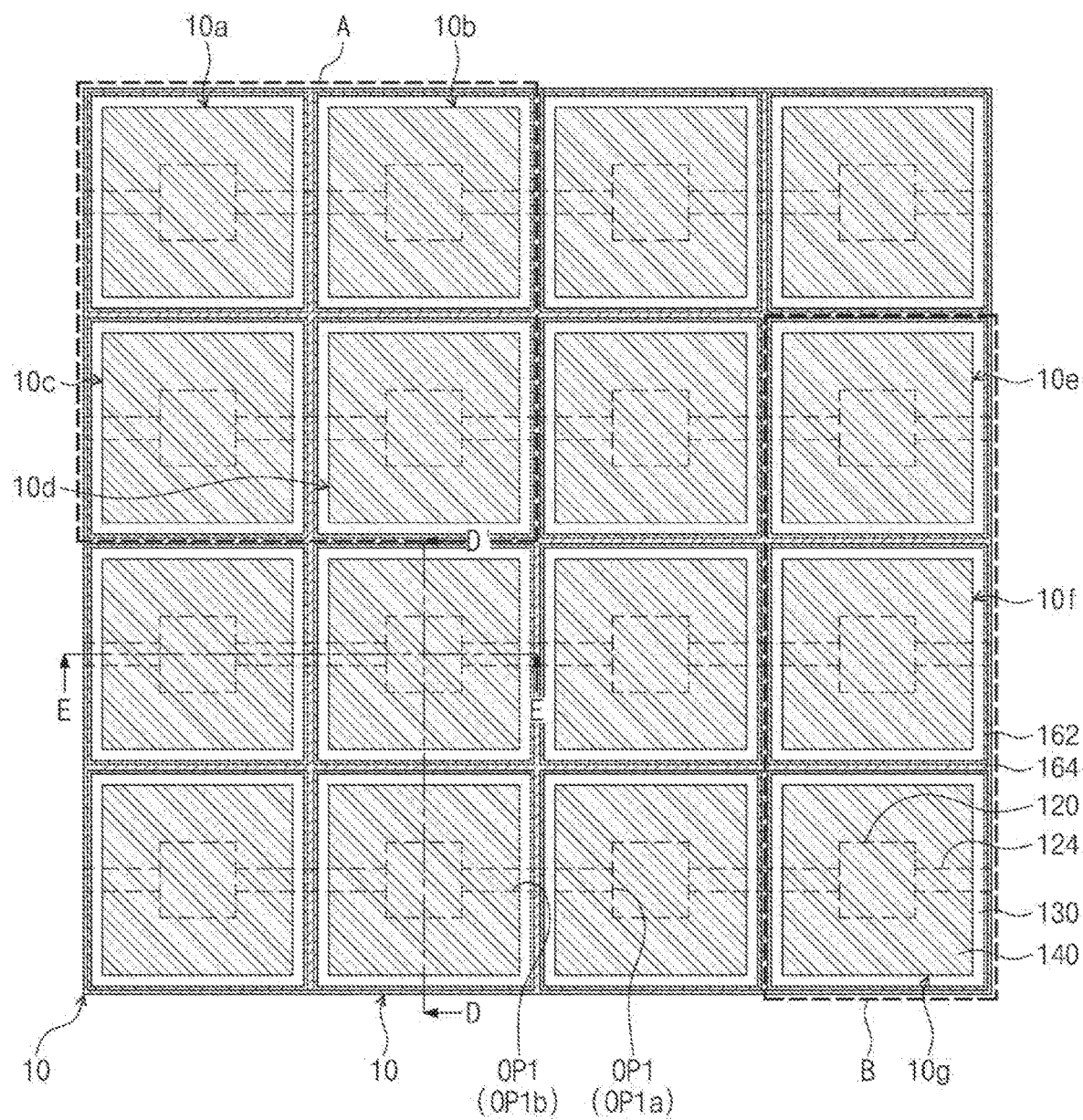
FIG. 9 illustrates a plan view showing a method of fabricating a semiconductor light emitting device array according to some example embodiments.
Figure 10:
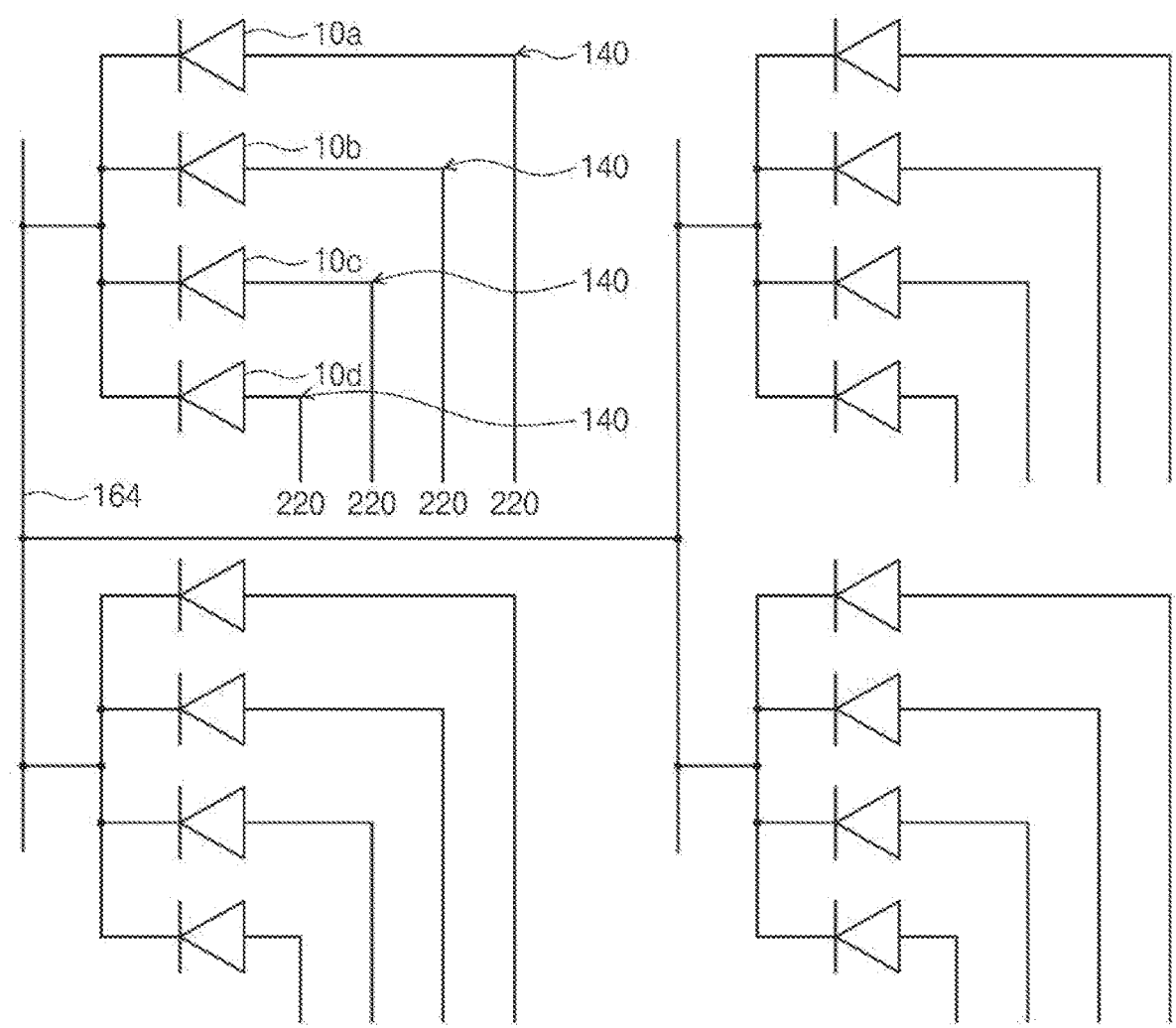
FIG. 10 illustrates a circuit diagram showing a semiconductor light emitting device array according to some example embodiments.
Figure 12A:
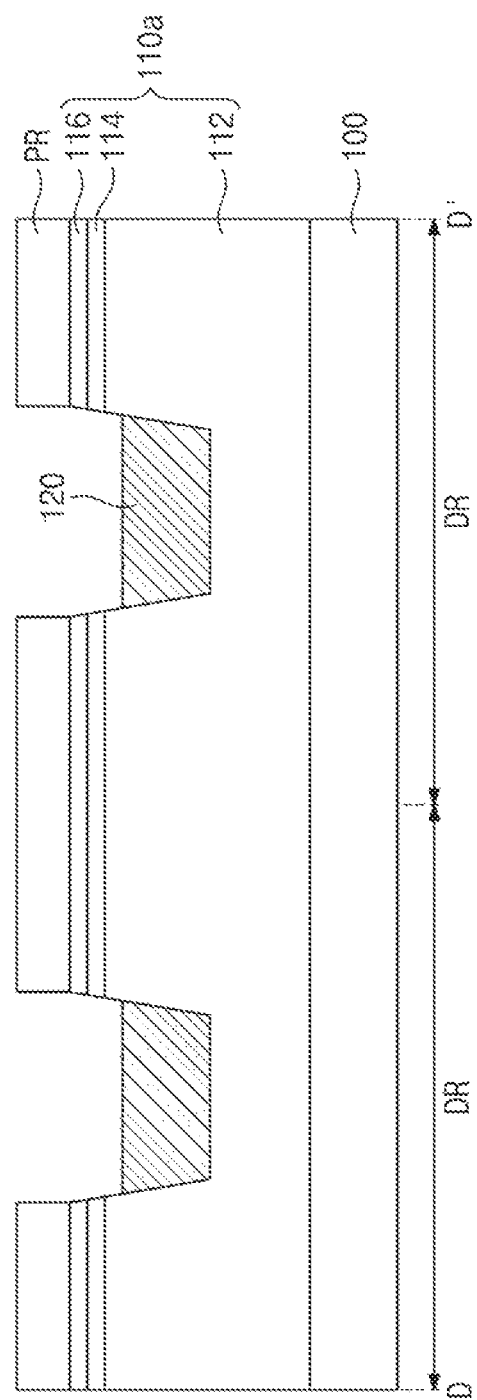
Figure 13A:
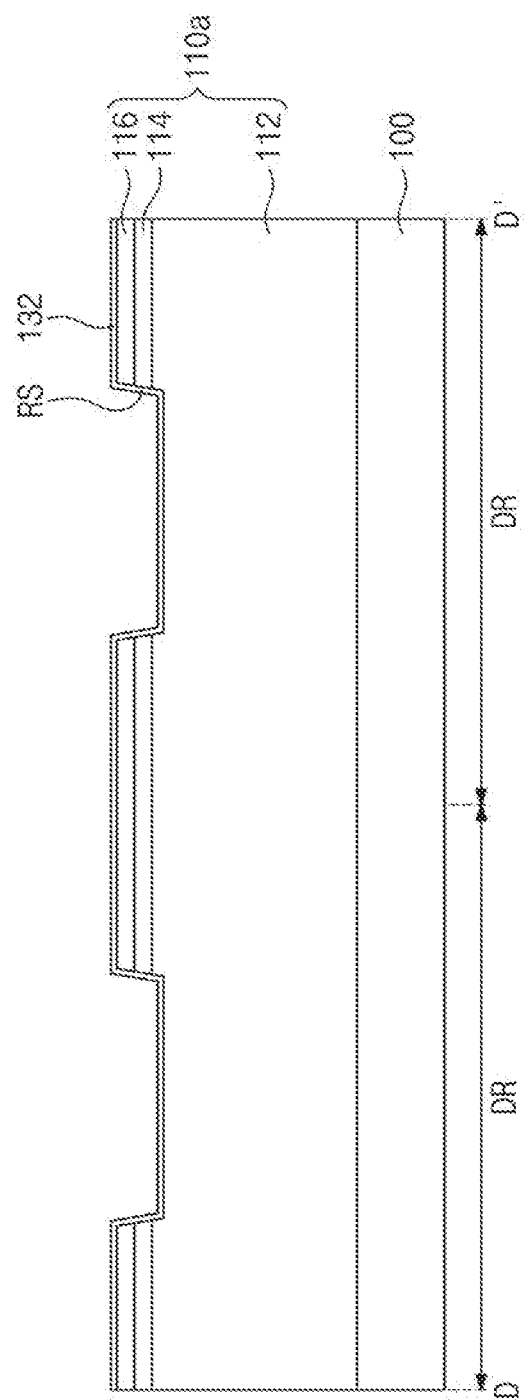
Figure 13B:
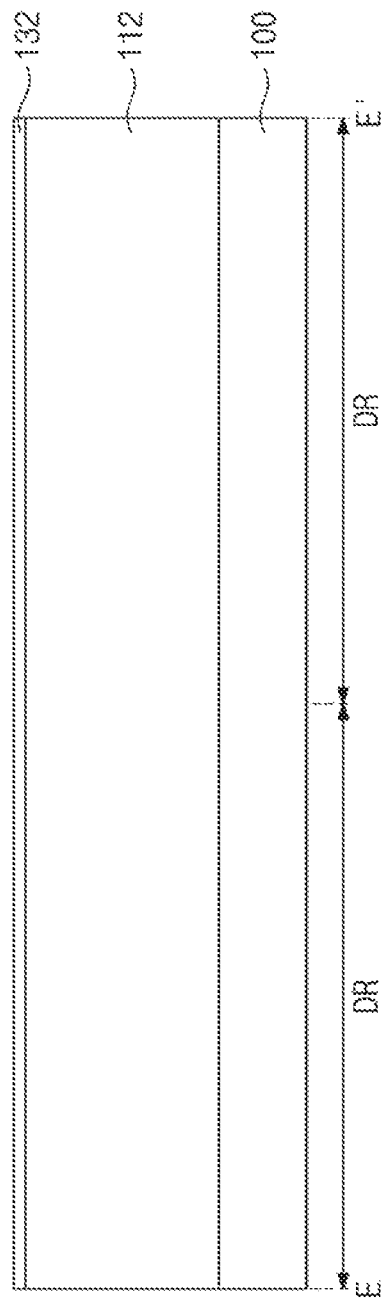

FIG. 9 illustrates a plan view showing a method of fabricating a semiconductor light emitting device array according to some example embodiments. FIG. 10 illustrates a circuit diagram showing a semiconductor light emitting device array according to some example embodiments. FIGS. 11A to 23A and 11B to 23B illustrate cross-sectional views showing a method of fabricating a semiconductor light emitting device array according to some example embodiments. FIGS. 11A to 23A correspond to cross-sections taken along line D-D' of FIG. 9, and FIGS. 11B to 23B correspond to cross-sections taken along line E-E' of FIG. 9.

Referring to FIGS. 9, 10, 11A, and 11B, a growth substrate 100 may be provided. The growth substrate 100 may have a plurality of device regions DR. In this description, the term "device regions DR" may be areas on which semiconductor light emitting devices 10 are correspondingly formed. Each of the semiconductor light emitting devices 10 may be the semiconductor light emitting device 10 discussed with reference to FIGS. 1 to 6. The plurality of device regions DR may be arranged two-dimensionally. A single semiconductor light emitting device 10 may be formed on one device region DR.

A growth structure 110a may be formed on the growth substrate 100. The growth structure 110a may include a first semiconductor layer 112, an active layer 114, and a second semiconductor layer 116 that are sequentially stacked on the growth substrate 100. For example, the first semiconductor layer 112 may be formed of n-type GaN, and the second semiconductor layer 116 may be formed of p-type GaN. For example, the active layer 114 may be formed by alternately stacking multi-well layers of InGaN and quantum barrier layers of GaN. Each of the first semiconductor layer 112, the active layer 114, and the second semiconductor layer 116 may be formed by using metal organic chemical vapor deposition (MOCVD), hydride vapor phase epitaxy (HVPE), or molecular beam epitaxy (MBE).

The growth structure 110a may be partially etched to expose a portion of the first semiconductor layer 112. For example, the second semiconductor layer 116, the active layer 114, and the first semiconductor layer 112 may be partially and sequentially etched to form first openings OP1 that expose the first semiconductor layer 112. The first openings OP1 may be formed on corresponding central portions of the device regions DR. A portion of each of the first openings OP1 may have a shape that extends in one direction. For example, each of the first openings OP1 may have a first segment OP1a formed on the central portion of the device region DR and also have a second segment OP1b formed extending in one direction from the first segment OP1a. When viewed in plan, on one device region DR, the second segment OP1b may pass through the first segment OP1a.

Referring to FIGS. 9, 10, 12A, and 12B, first electrodes 120 may be formed in the first openings OP1. For example, a photoresist PR may be formed on the second semiconductor layer 116, exposing the first openings OP1. A conductive material may be deposited to fill the first openings OP1 and to cover the photoresist PR. Afterwards, a lift-off process may be executed to remove the conductive material on the photoresist PR, or an etch-back process may be performed on the conductive material. After the etch-back process, portions of the conductive material may remain in the first openings OP1. First electrodes 120 may be defined to refer to the remaining portions of the conductive material in the first openings OP1. At this stage, the etch-back process may continue until the first electrodes 120 have their top surfaces lower than a bottom surface of the active layer 114. As discussed with reference to FIGS. 7 and 8, the first electrodes 120 may have portions, defined as extension portions 124, that fill second segments OP1b of the first openings OP1, and the extension portions 124 may extend in one direction from corresponding first electrode 120.

In other example embodiments, before the formation of the first openings OP1, recesses RS may be formed. Referring to FIGS. 9, 10, 13A, and 13B, a portion of the growth structure 110a may be etched to partially expose the first semiconductor layer 112. For example, the second semiconductor layer 116, the active layer 114, and the first semiconductor layer 112 may be partially and sequentially etched to form the recesses RS that expose the first semiconductor layer 112. The recesses RS may be formed on corresponding central portions of the device regions DR.

A second dielectric layer 132 may be formed on the growth structure 110a. The second dielectric layer 132 may cover a top surface of the second semiconductor layer 116, inner lateral surfaces of the recesses RS, and bottom surfaces of the recesses RS. For example, the second dielectric layer 132 may cover an exposed lateral surface of the active layer 114 and of the second semiconductor layer 116. The second dielectric layer 132 may prevent the active layer 114 and the second semiconductor layer 116 from contacting first electrodes which will be formed in the following subsequent process.

Figure 14A:
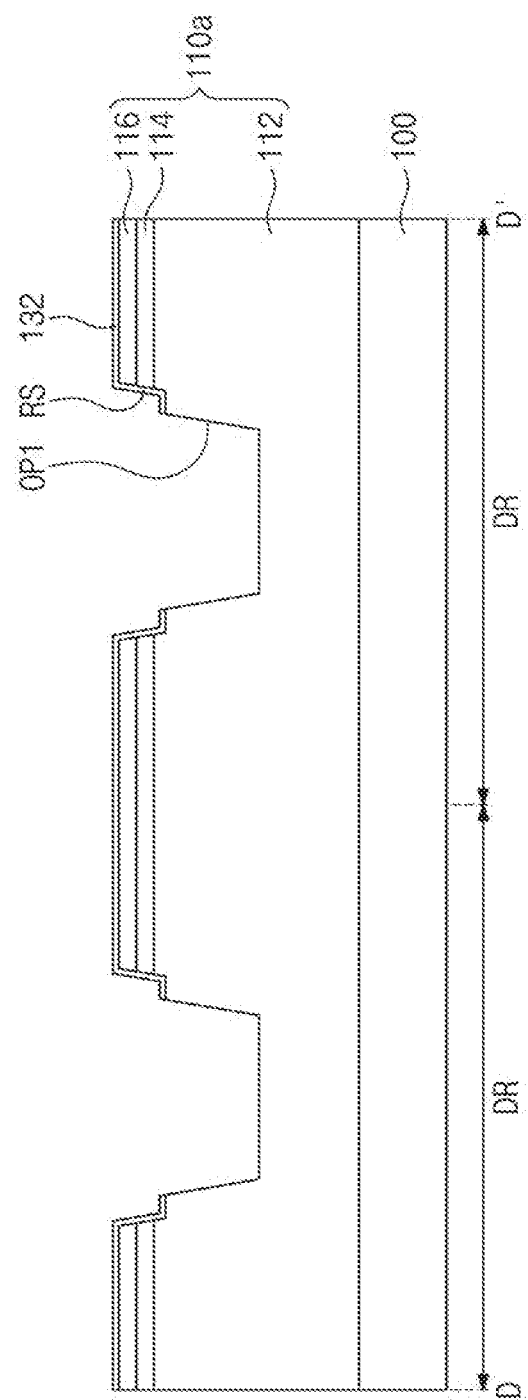
Figure 14B:
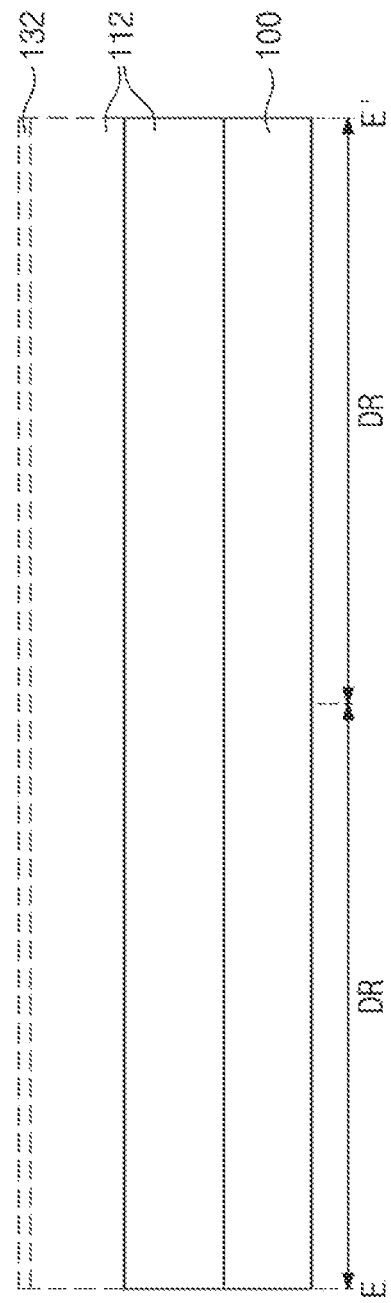

Referring to FIGS. 9, 14A, and 14B, an etching process may be performed in which the second dielectric layer 132 and the first semiconductor layer 112 are partially and sequentially etched to form first openings OP1 that expose the first semiconductor layer 112. The etching process may be performed on a bottom surface of the second dielectric layer 132. For example, the first openings OP1 may be formed on corresponding bottom surfaces of the recesses RS. Each of the first openings OP1 may have a first segment OP1a formed on the central portion of the device region DR, and may also have a second segment OP1b formed extending in one direction from the first segment OP1a. Thereafter, the first openings OP1 may be filled with a conductive material to form first electrodes 120. Through the processes above, for example, with respect to FIGS. 12A and 12B, it may be possible to form a semiconductor light emitting device array discussed with reference to FIGS. 5 and 6. The following will continue to explain the example shown in FIGS. 9, 10, 12A, and 12B.

Figure 15A:
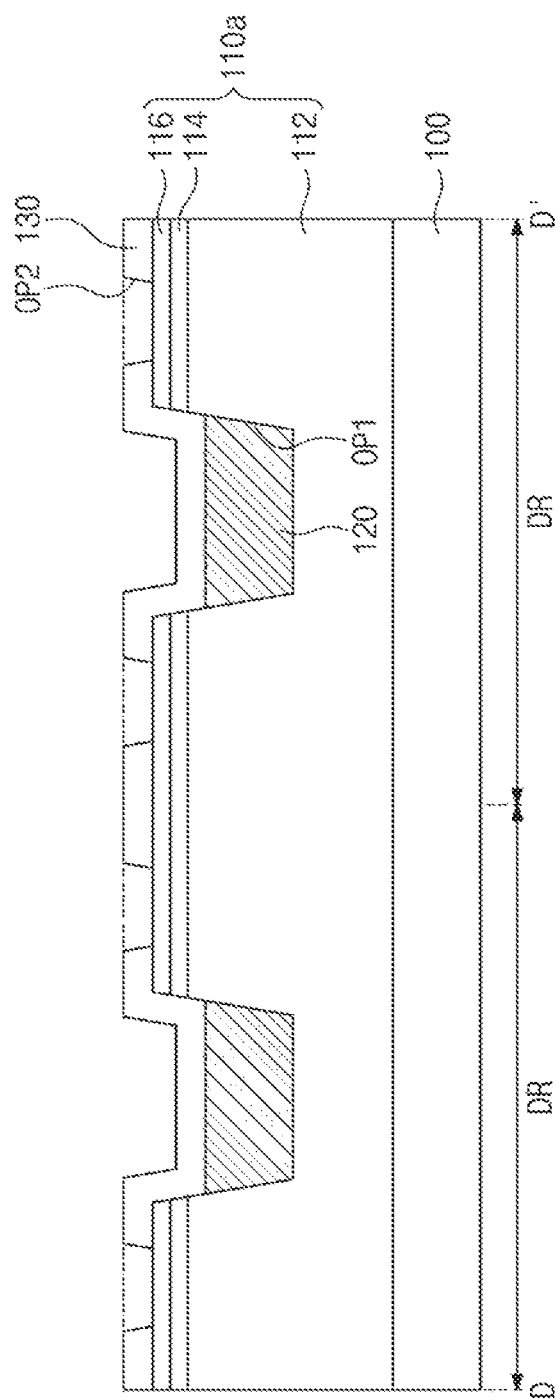
Figure 15B:
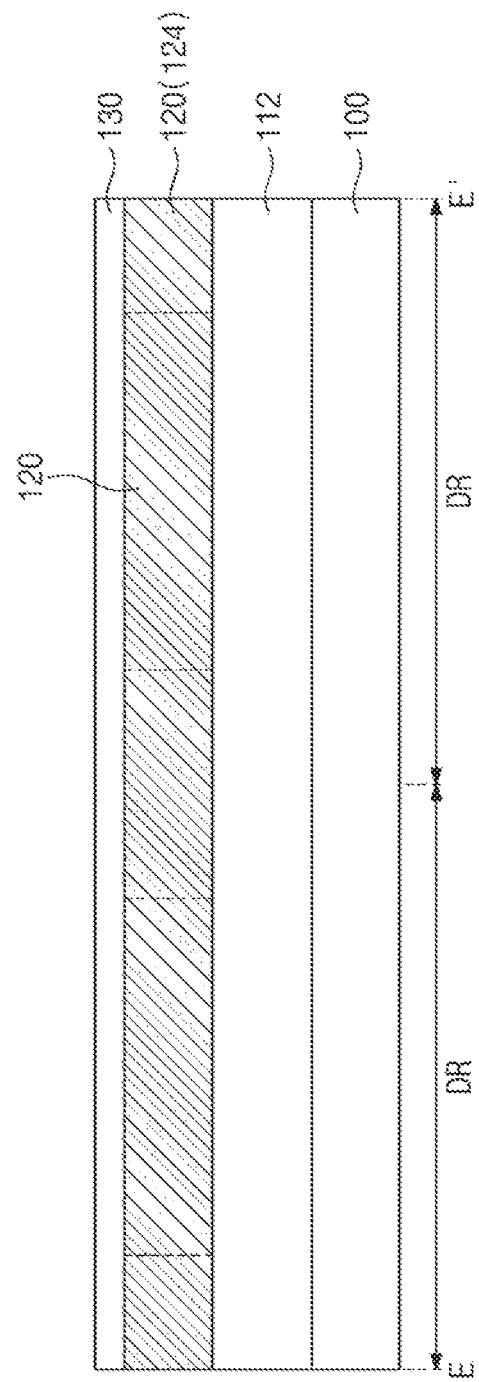

Referring to FIGS. 9, 15A, and 15B, a first dielectric layer 130 may be formed on the growth structure 110a. The first dielectric layer 130 may cover the top surfaces of the first electrodes 120 and the top surface of the second semiconductor layer 116. The first dielectric layer 130 may conformally cover the top surface of the second semiconductor layer 116 and inner lateral surfaces of the first openings OP1. The first dielectric layer 130 may be formed by deposition, such as chemical vapor deposition (CVD) or physical vapor deposition (PVD).

After that, second openings OP2 may be formed in the first dielectric layer 130. The second openings OP2 may penetrate the first dielectric layer 130, thereby exposing the top surface of the second semiconductor layer 116.

Figure 16A:
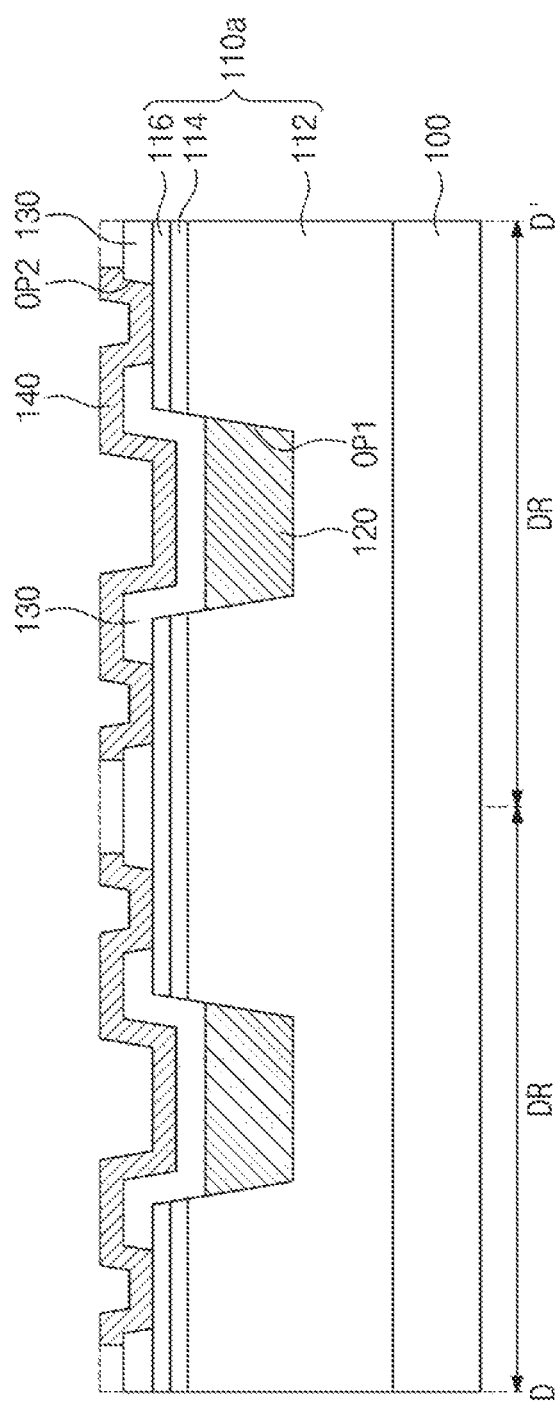
Figure 16B:
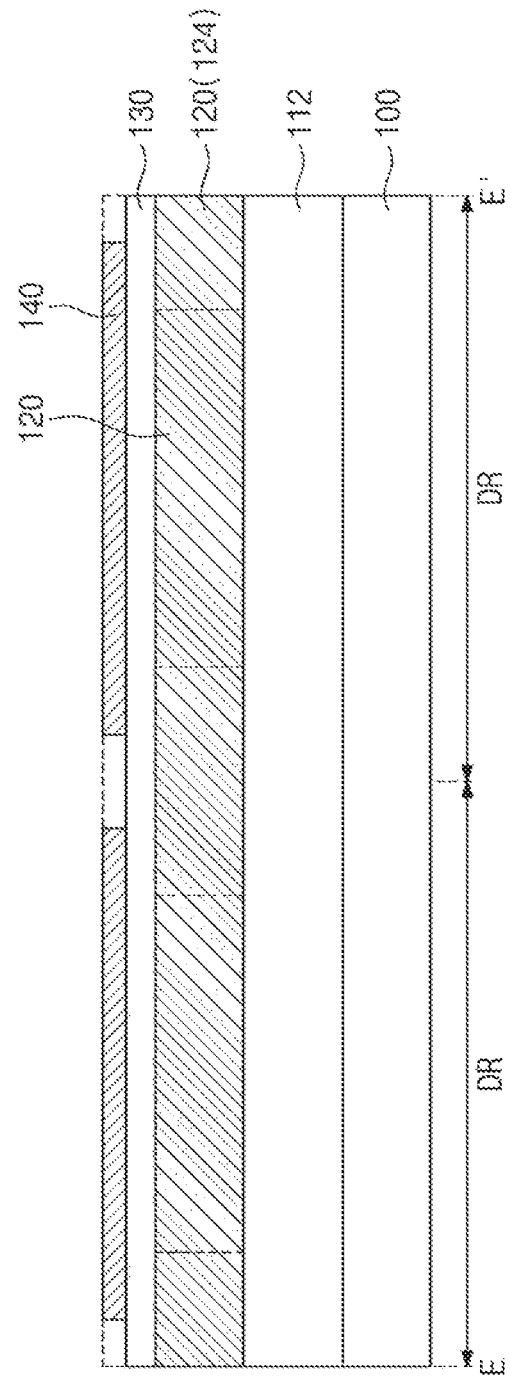

Referring to FIGS. 9, 16A, and 16B, second electrodes 140 may be formed to cover a top surface of the first dielectric layer 130 and to partially fill the second openings OP2. The second electrodes 140 may be in contact with the second semiconductor layer 116. For example, the second electrodes 140 may be formed by using on the growth substrate 100 a deposition process, such as physical vapor deposition (PVD), to from a reflective metal layer, and then patterning the reflective metal layer. The reflective metal layer may include, for example, silver (Ag) or aluminum (Al). Each of the second electrodes 140 may be formed on the central portion of the device region DR, and may overlap its underlying first electrode 120. For example, the second electrodes 140 may be formed to cover the first electrodes 120. In addition, the second electrodes 140 may be formed so as to expose the first dielectric layer 130 on outer edges of the device regions DR, as illustrated in FIG. 16A. In other example embodiments, the second electrodes 140 may be formed to completely fill the second openings OP2.

Figure 17A:
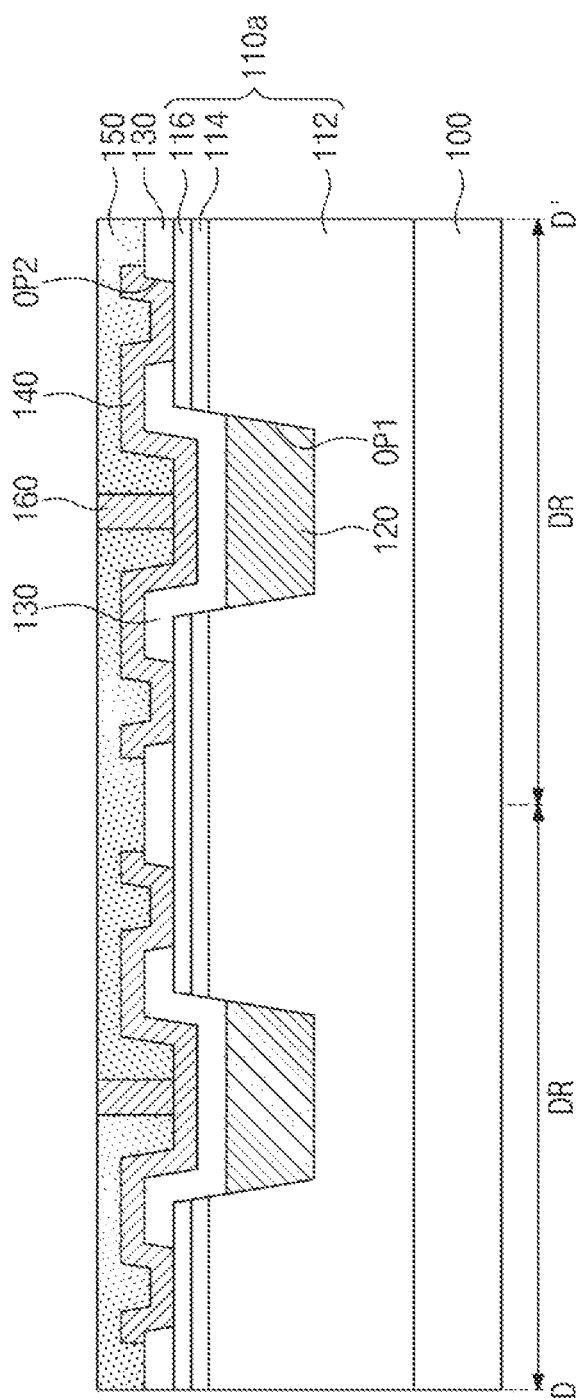

Referring to FIGS. 9, 17A, and 17B, a third dielectric layer 150 may be formed on the first dielectric layer 130. The third dielectric layer 150 may cover the first dielectric layer 130 and the second electrodes 140. The third dielectric layer 150 may be formed by deposition, such as chemical vapor deposition (CVD) or physical vapor deposition (PVD).

Connection terminals 160 may be formed in the third dielectric layer 150. For example, holes exposing the second electrodes 140 may be formed, and then the holes may be filled with a conductive material to form the connection terminals 160.

Figure 18A:
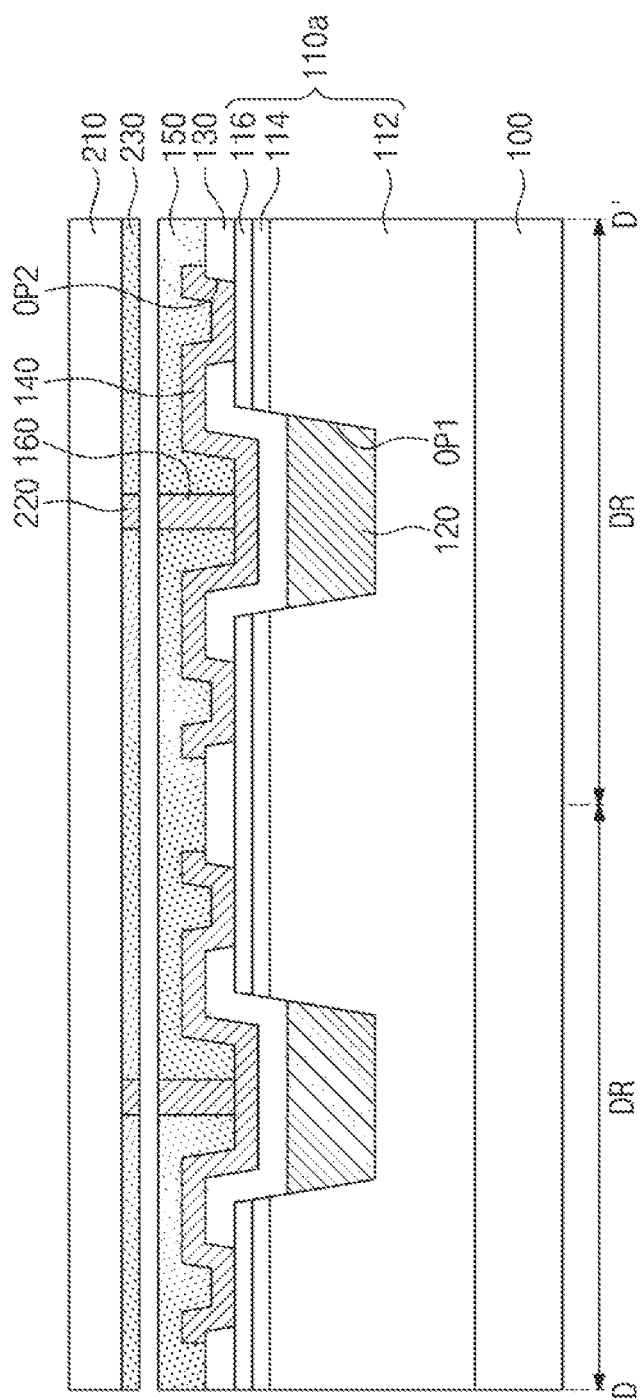
Figure 18B:
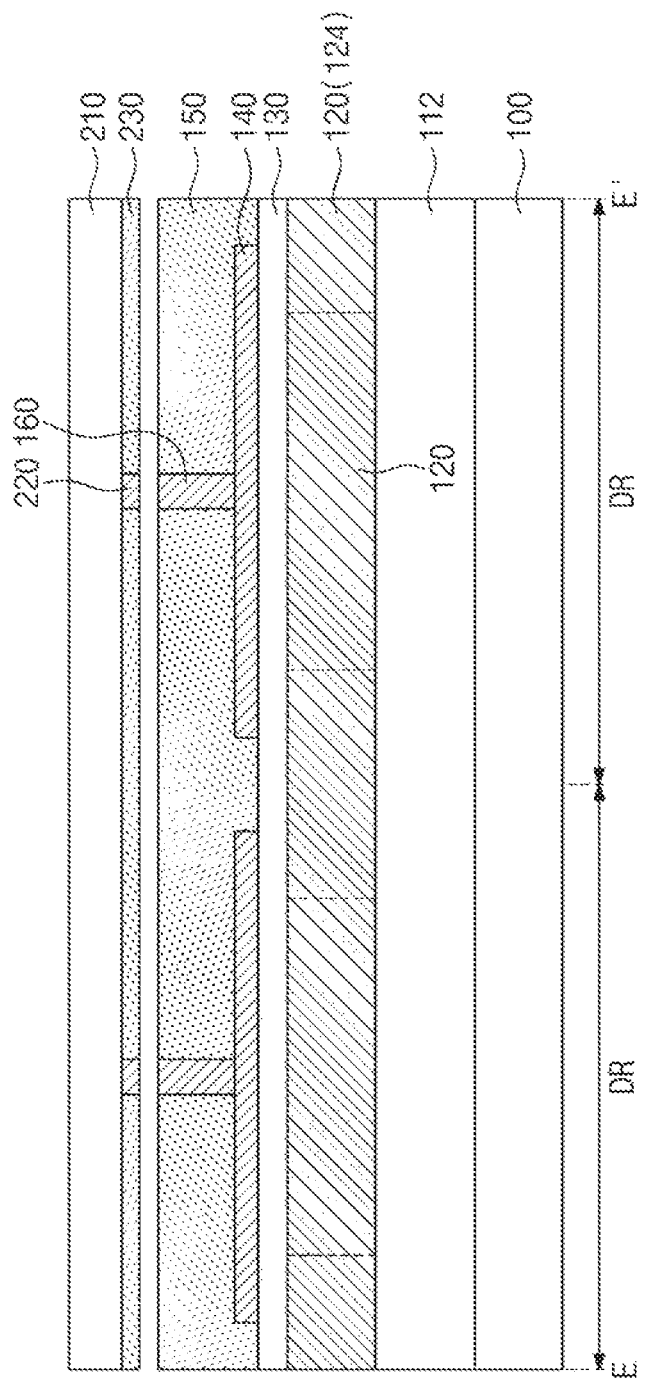

Referring to FIGS. 9, 18A, and 18B, a wiring substrate 210 may be provided. The wiring substrate 210 may have connection patterns 220 and a substrate dielectric layer 230 that are formed on one surface thereof. The connection patterns 220 may be exposed on one surface of the substrate dielectric layer 230. In some example embodiments, the wiring substrate 210, the connection patterns 220 and the substrate dielectric layer 230 may be formed separately from the components of FIGS. 11A-17B.

The wiring substrate 210 may be aligned with the growth structure 110a. In this case, the wiring substrate 210 may be aligned to align the substrate dielectric layer 230 with the third dielectric layer 150, and the connection patterns 220 with the connection terminals 160.

Figure 19A:
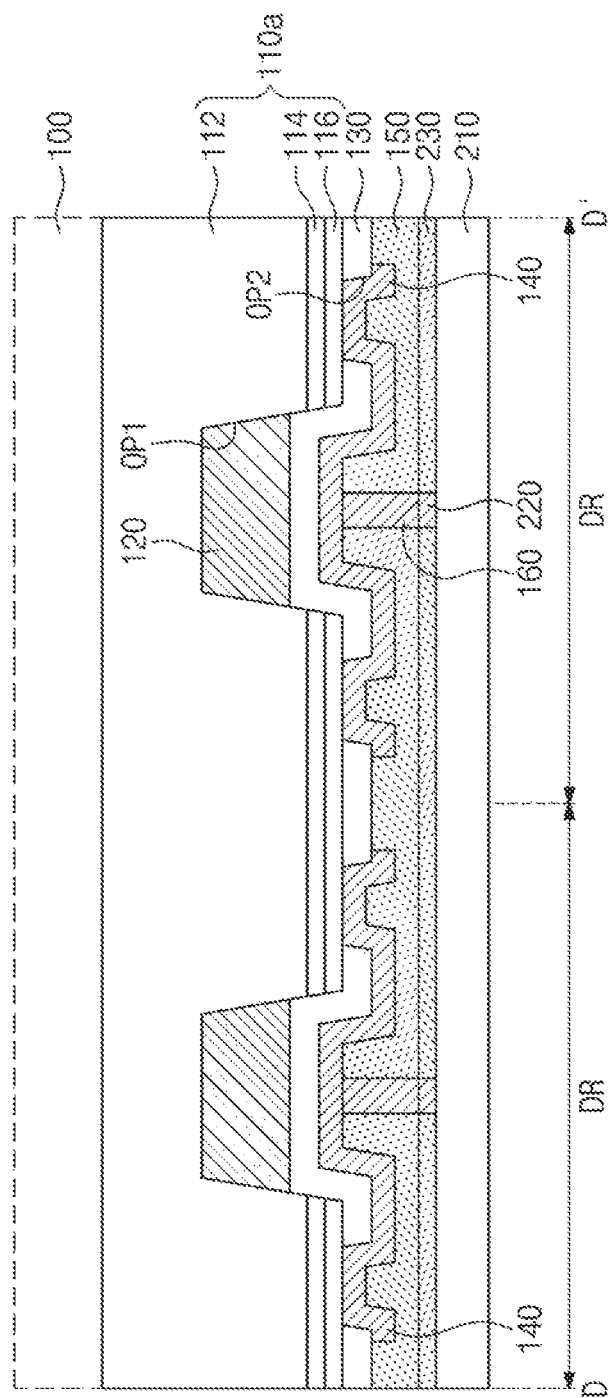
Figure 19B:
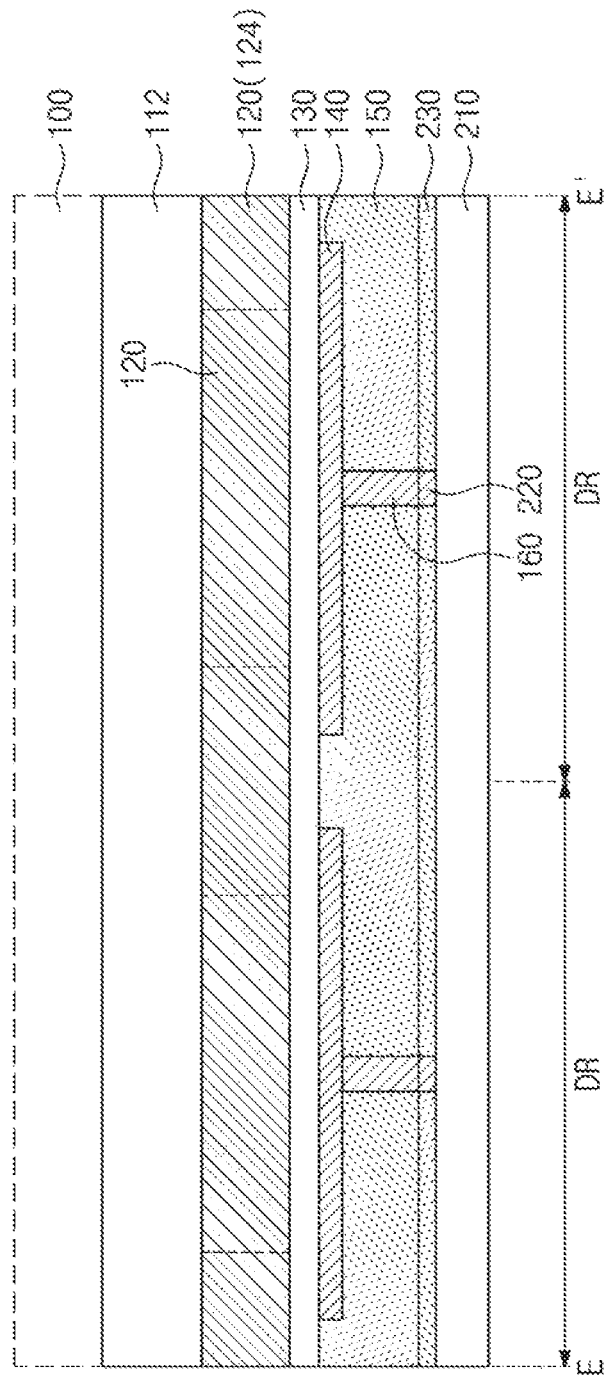

Referring to FIGS. 9, 19A, and 19B, the wiring substrate 210 may be attached onto the growth structure 110a. The connection patterns 220 of the wiring substrate 210 may be coupled to the connection terminals 160. The connection patterns 220 of the wiring substrate 210 may be electrically connected through the connection terminals 160 to the second electrodes 140. In this case, the second electrodes 140 of each of semiconductor light emitting devices 10a, 10b, 10c, and 10d may be coupled to a separate circuit line of the wiring substrate 210. For example, as shown in FIG. 10, external signals applied through the second electrodes 140 may drive the semiconductor light emitting devices 10a, 10b, 10c, and 10d to operate independently of each other. The substrate dielectric layer 230 of the wiring substrate 210 may be in contact with the third dielectric layer 150. In this case, the substrate dielectric layer 230 and the third dielectric layer 150 may be attached to each other.

As illustrated in FIGS. 19A and 19B, the growth structure 110a may be turned upside down to place the growth substrate 100 upwardly above the wiring substrate 210. Afterwards, the growth substrate 100 may be removed.

Figure 20A:
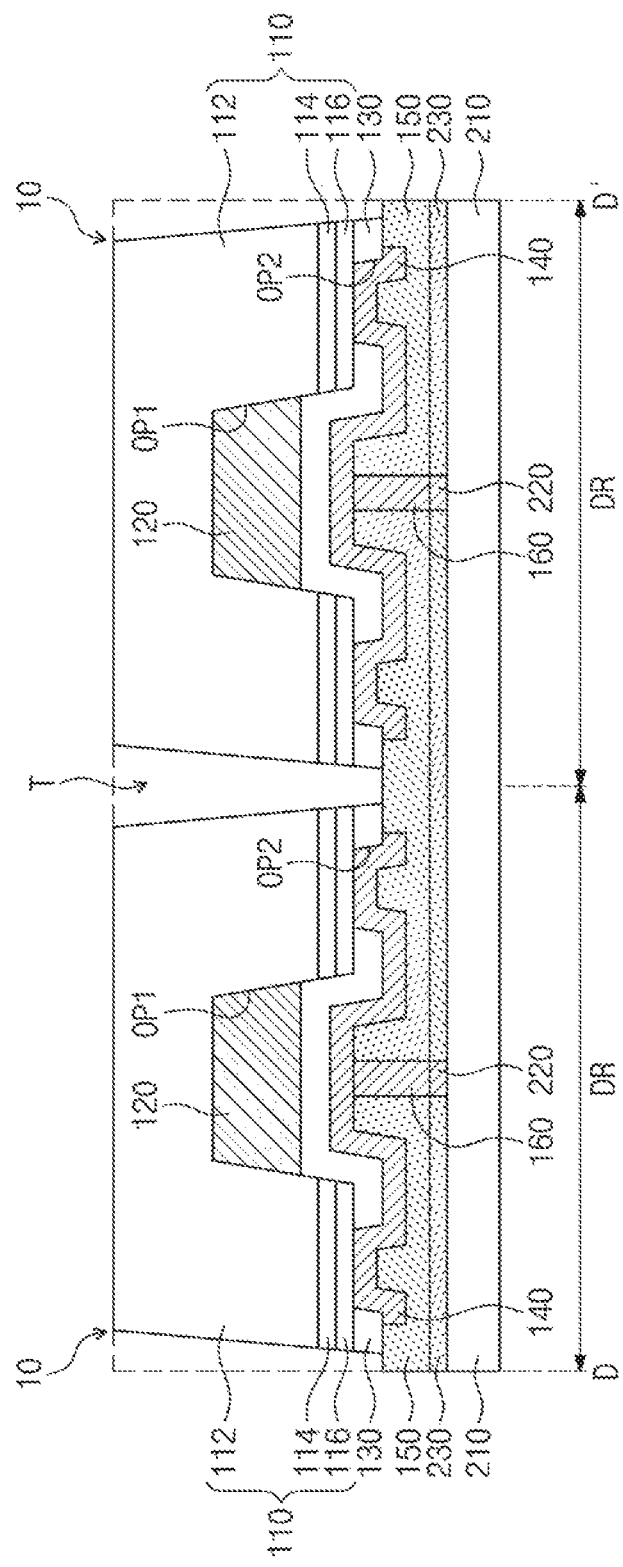
Figure 20B:
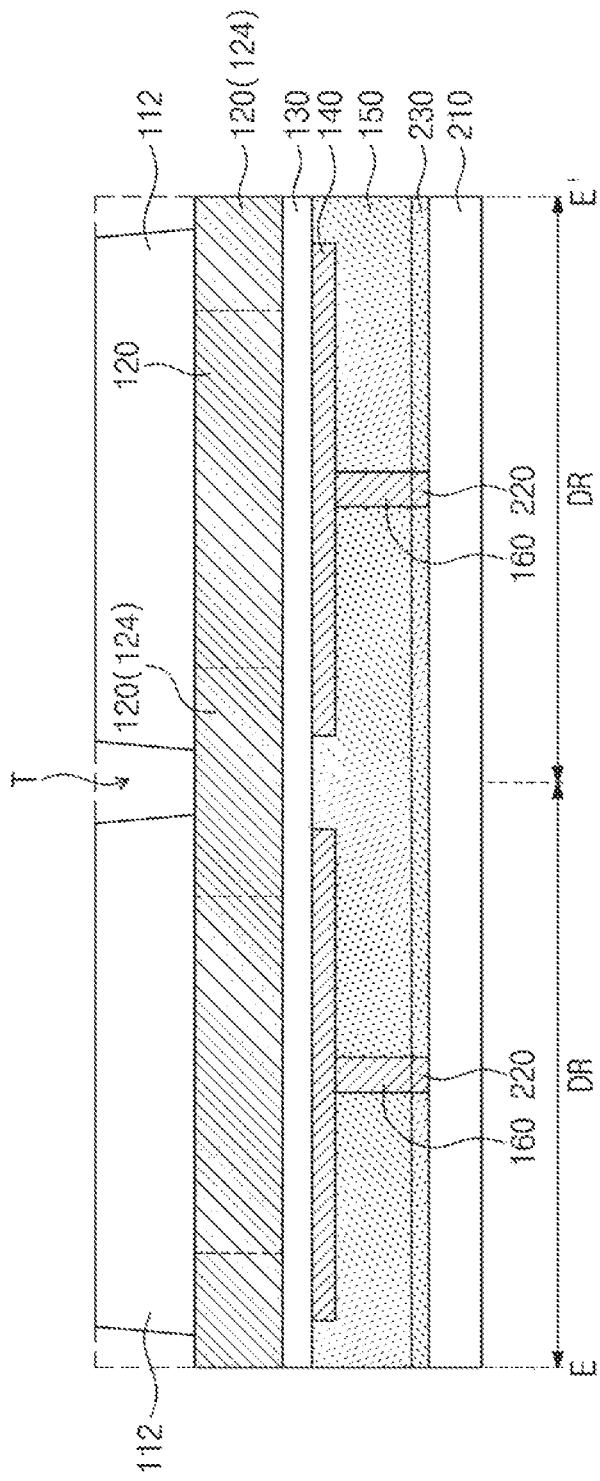

Referring to FIGS. 9, 20A, and 20B, the growth structure 110a may be etched to form light emitting structures 110. For example, an etching process may be performed in which the first semiconductor layer 112, the active layer 114, and the second semiconductor layer 116 are sequentially etched to form a trench T. The etching process may cause each of the first semiconductor layer 112, the active layer 114, and the second semiconductor layer 116 to be separated into a plurality of pieces. The trench T may be formed on edges of the device regions DR. For example, when viewed in plan, the trench T may surround the central portions of the device regions DR. The light emitting structures 110 may be formed on corresponding central portions of the device regions DR, and the trench T may separate the light emitting structures 110 from each other. The trench T may expose the third dielectric layer 150. The extension portion 124 of the first electrode 120 may not be etched during the etching process. The extension portion 124 of the first electrode 120 may thus have an exposed top surface. In other example embodiments, the extension portion 124 may be etched during the etching process, and may not be exposed to the trench T.

The semiconductor light emitting devices 10 may be constituted or formed each of which includes the light emitting structure 110, the first electrode 120, the first dielectric layer 130, and the second electrode 140. As discussed above, the semiconductor light emitting devices 10 may be provided on corresponding device regions DR.

Figure 21A:
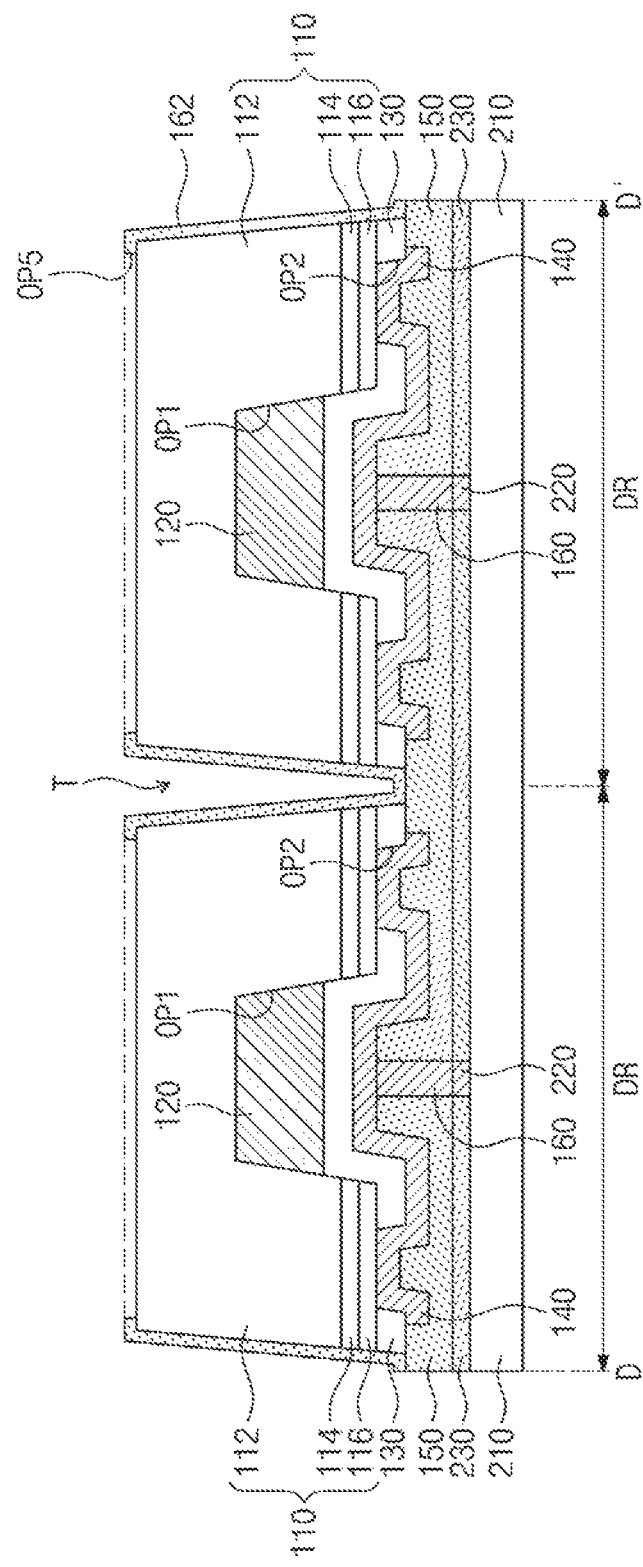
Figure 21B:
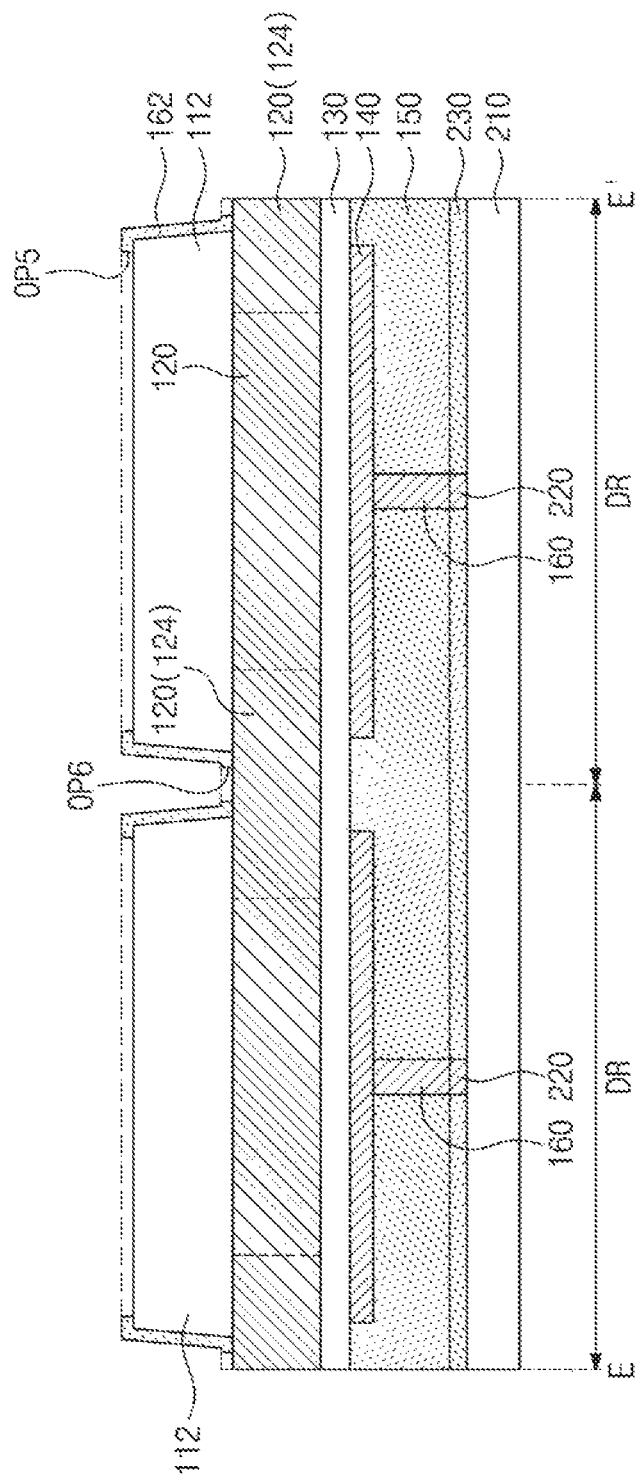

Referring to FIGS. 9, 21A, and 21B, a device isolation layer 162 may be formed on the light emitting structure 110. The device isolation layer 162 may be formed by coating or depositing a dielectric material on a top surface of the first semiconductor layer 112 and inner lateral and bottom surfaces of the trench T.

Fifth openings OP5 and sixth openings OP6 may be formed in the device isolation layer 162. The fifth openings OP5 may be formed on corresponding central portions of the device regions DR, thereby exposing the top surfaces of the first semiconductor layers 112. The sixth openings OP6 may be formed on corresponding edges of the device regions DR, thereby exposing the top surfaces of the extension portions 124 included in the first electrodes 120.

Figure 22A:
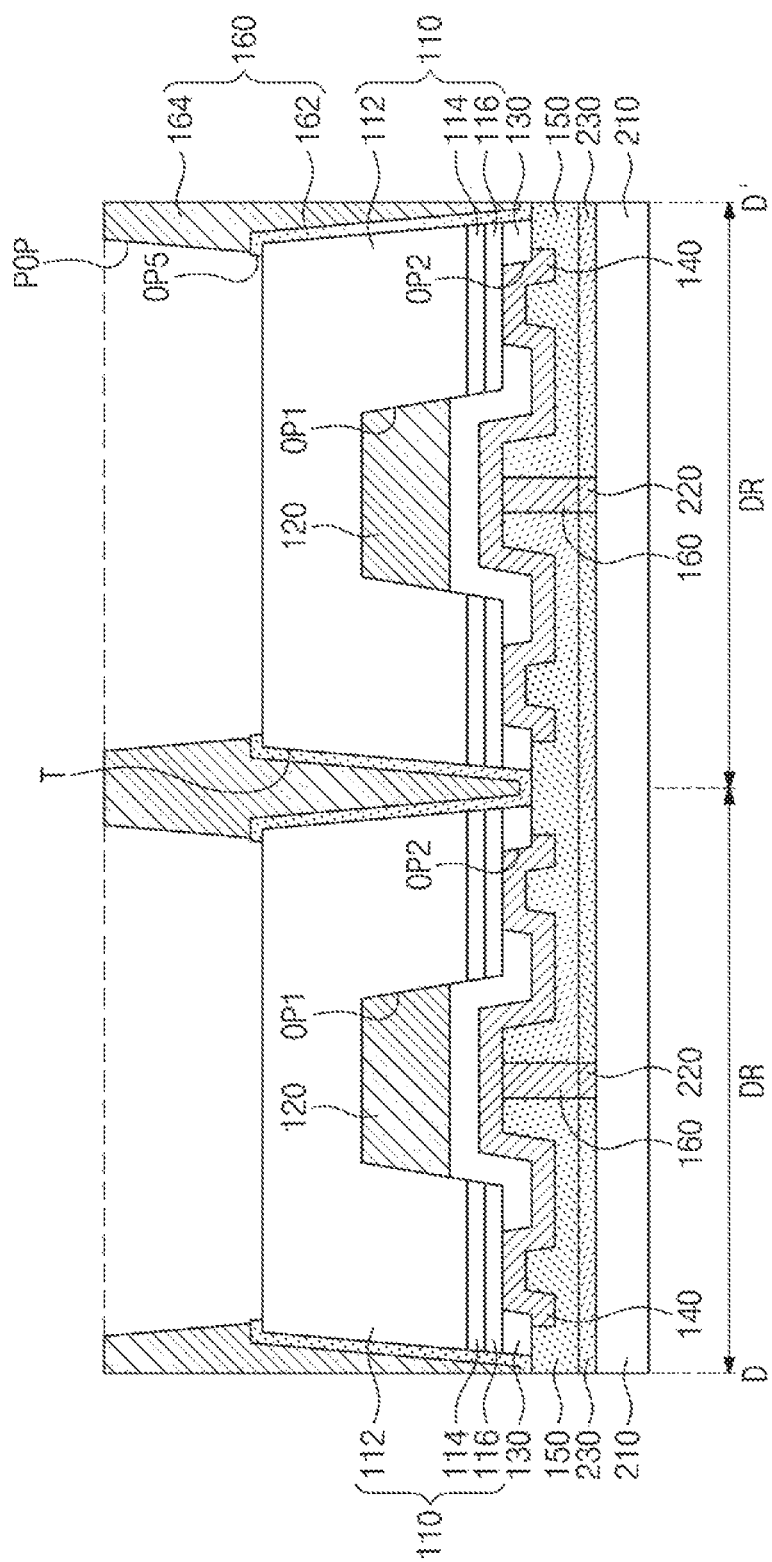
Figure 22B:
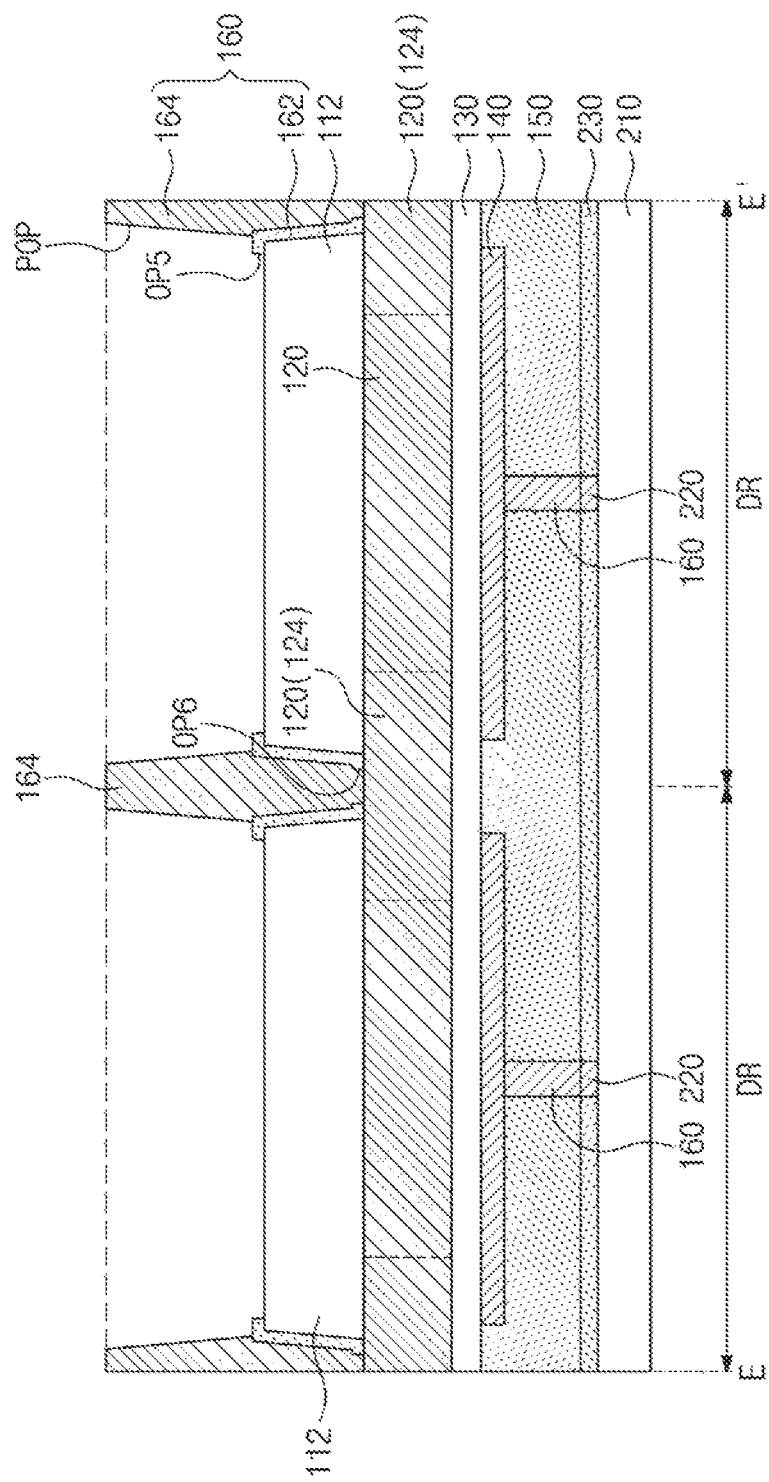

Referring to FIGS. 9, 22A, and 22B, a vertical conductive pattern 164 may be formed on the light emitting structures 110. For example, a conductive layer may be formed on the light emitting structures 110. The conductive layer may cover the first semiconductor layers 112 and the device isolation layer 162. The conductive layer may pass through the fifth openings OP5 of the device isolation layer 162 and may contact the top surfaces of the first semiconductor layers 112, and may pass through the sixth openings OP6 of the device isolation layer 162 and may contact the extension portion 124 of the first electrode 120. After that, an etching process may be performed in which the conductive layer is etched to form the vertical conductive pattern 164 illustrated in FIGS. 22A and 22B. The etching process may form pixel openings POP that vertically penetrate the vertical conductive pattern 164 and expose the top surfaces of the first semiconductor layers 112. FIGS. 22A and 22B show that the conductive layer is formed on the light emitting structures 110 and then is patterned to form the vertical conductive pattern 164, but example embodiments are not limited thereto. In other example embodiments, sacrificial patterns may be formed on areas where the pixel openings POP will be formed, and thereafter spaces between the light emitting structures 110 and between the sacrificial patterns may be filled with a conductive material to form the vertical conductive pattern 164. In this case, the filling of the conductive material may be performed by using a plating process or a deposition process. The vertical conductive pattern 164 may serve as a partition wall to prevent mutual interference of light generated from the light emitting structures 110 of the device regions DR. Accordingly, the light emitting structures 110 may independently constitute pixels that generate light different from each other. For example, a single pixel may be provided on one device region DR. The vertical conductive pattern 164 may be electrically connected to the extension portion 124 of the first electrode 120 included in each of the light emitting structures 110. For example, the vertical conductive pattern 164 may be coupled to all of the first electrodes 120 of the semiconductor light emitting devices 10, and as shown in FIG. 10, may serve as a common electrode of the semiconductor light emitting devices 10. Differently from that shown, in some example embodiments, the vertical conductive pattern 164 may be provided in plural, and the plurality of vertical conductive patterns 164 may surround corresponding semiconductor light emitting devices 10 and may be insulated from each other. For example, each of the vertical conductive patterns 164 may be a separate electrode of the semiconductor light emitting devices 10 corresponding thereto. The light emitting structure 110 may be coupled to an external circuit through the first electrode 120 and the vertical conductive pattern 164.

Figure 23A:
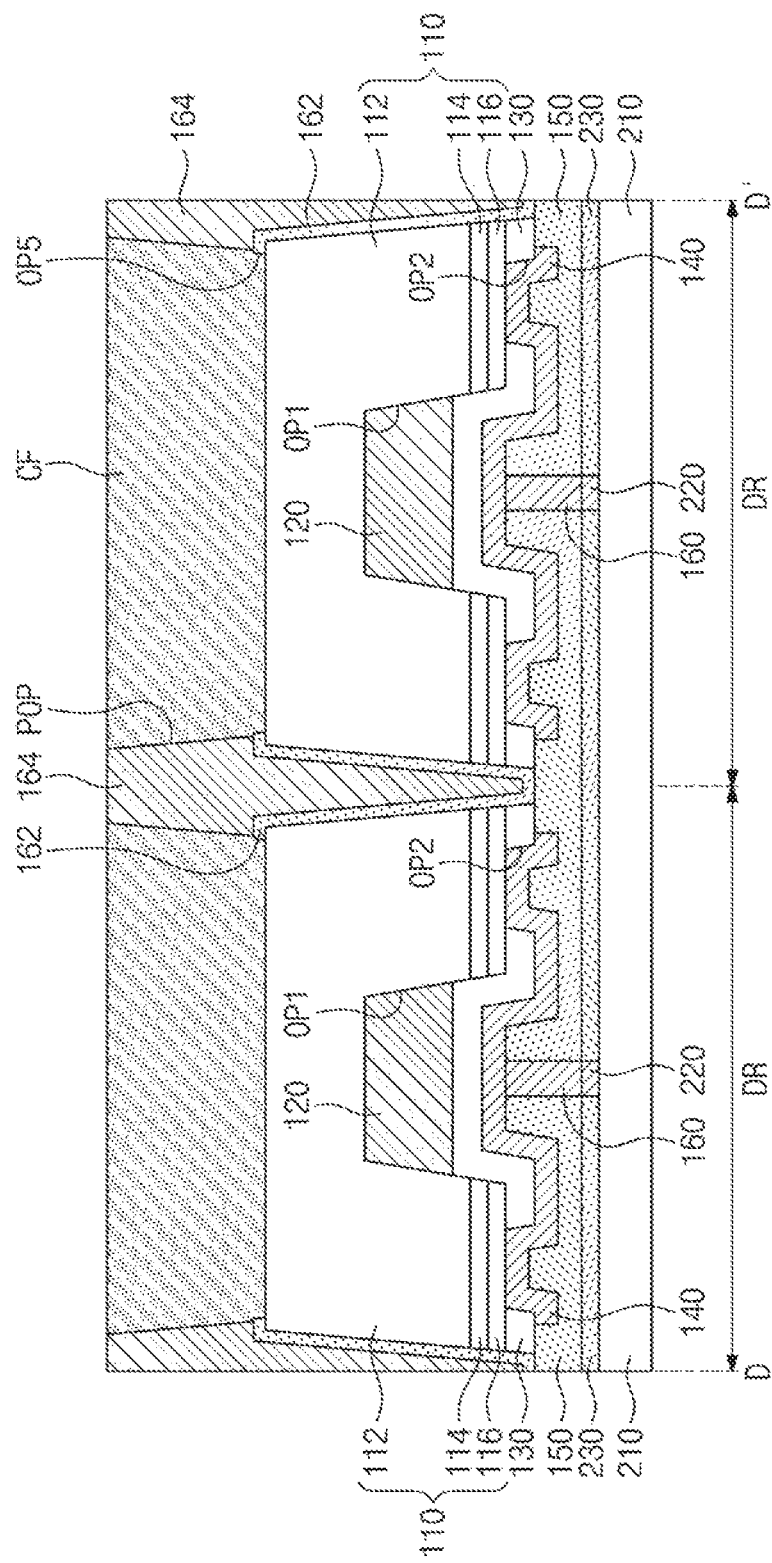
Figure 23B:
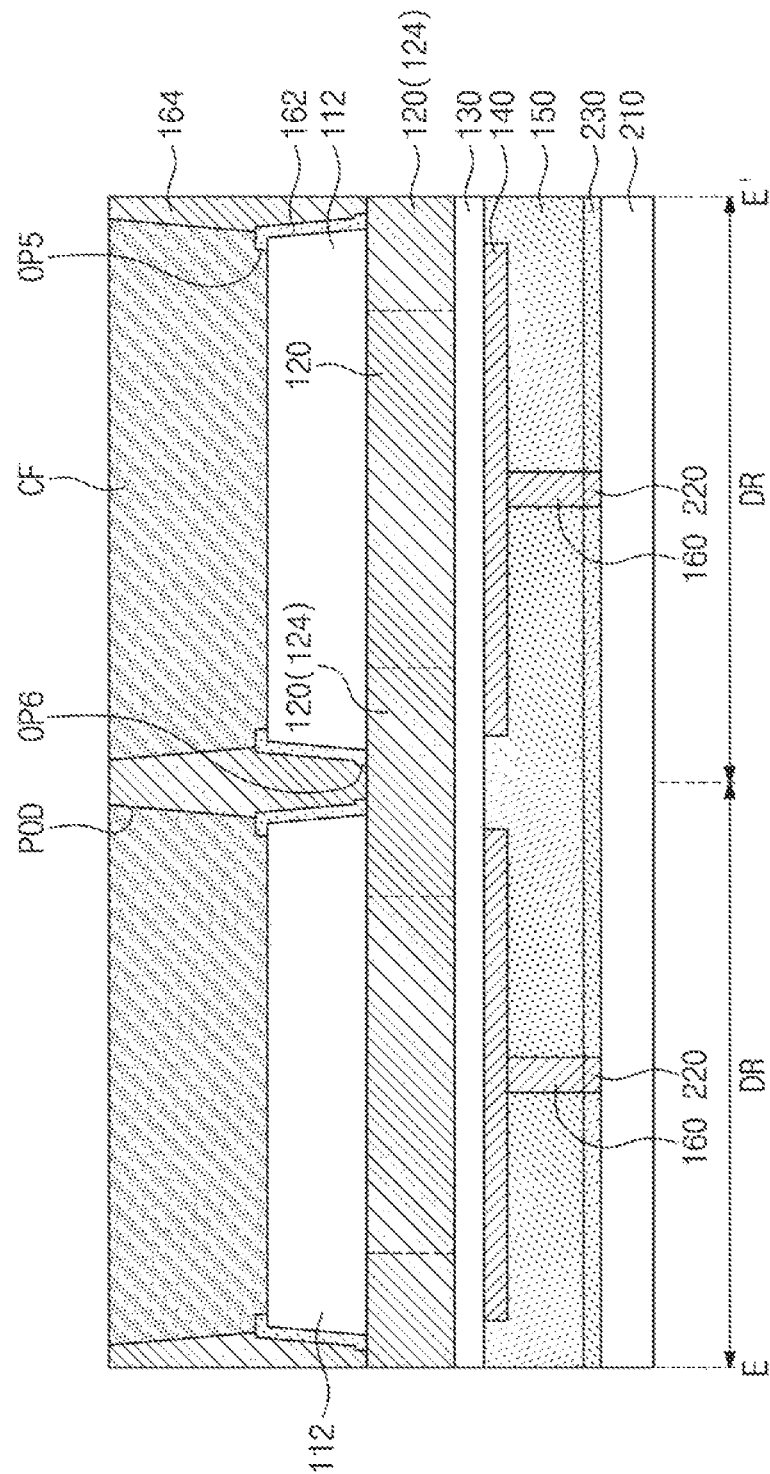

Referring to FIGS. 9, 23A, and 23B, wavelength conversion layers CF may be formed in the pixel openings POP. For example, a dispensing process may be performed in which the pixel openings POP are provided therein with a fluorescent material to form the wavelength conversion layers CF. During the operation of a semiconductor light emitting device array, the wavelength conversion layers CF may convert light emitted from corresponding semiconductor light emitting devices 10 into desired wavelengths. The wavelength conversion layers CF may include a wavelength conversion material. The wavelength conversion material may convert light having a wavelength generated from the semiconductor light emitting device 10. For example, the wavelength conversion material may include a quantum-dot fluorescent material, which has a nano-sized particle. The quantum-dot fluorescent material may use a III-V or II-VI compound semiconductor to have a core-shell structure. For example, the core may include CdSe and/or InP. The shell may include ZnS and/or ZnSe. In addition, the quantum-dot fluorescent material may include a ligand to increase stability of the core and the shell. For another example, additional wavelength conversion particles may further be provided on an upper portion of one or more of the wavelength conversion layers CF. In some example embodiments, the wavelength conversion layers CF may include different fluorescent materials from each other on the device regions DR. For example, one of the wavelength conversion layers CF may include one of red, green, and blue fluorescent materials, and a neighboring one of the wavelength conversion layers CF may include another of red, green, and blue fluorescent materials. As shown in FIG. 10, a single pixel may be constituted by four semiconductor light emitting devices 10a, 10b, 10c, and 10d that are arranged adjacent to each other. For example, as illustrated in section A of FIG. 9, four semiconductor light emitting devices 10 may be provided which are arranged adjacent to each other in row and column directions in a grid shape, and light from one of the semiconductor light emitting devices 10a, 10b, 10c, and 10d may be converted by its corresponding wavelength conversion layer CF into a desired wavelength different from that of light from another of the semiconductor light emitting devices 10a, 10b, 10c, and 10d. For example, the wavelength conversion layer CF that corresponds to a first semiconductor light emitting device 10a may convert an emitted light into a red light, the wavelength conversion layers CF that correspond to second and third semiconductor light emitting devices 10b and 10c may covert an emitted light into a green light, and the wavelength conversion layer CF that corresponds to a fourth semiconductor light emitting device 10d may convert an emitted light into a blue light. Accordingly, four semiconductor light emitting devices 10a, 10b, 10c, and 10d may constitute a single RGB pixel. In other embodiments, light emitted from three ones 10a, 10b, and 10d of four semiconductor light emitting devices 10a, 10b, 10c, and 10d may be converted into a red light, a green light, and a blue light, and the third semiconductor light emitting device 10c may emit a white light without conversion. For example, the third semiconductor light emitting device 10c may omit the wavelength conversion layer CF, and instead include a transparent material layer. The third semiconductor light emitting device 10c that emits a white light may control brightness of a single pixel. The first electrodes 120 of four semiconductor light emitting devices 10a, 10b, 10c, and 10d may be coupled to the vertical conductive pattern 164 serving as a common electrode, and each of the second electrodes 140 of four semiconductor light emitting devices 10a, 10b, 10c, and 10d may be coupled to a separate circuit line of the wiring substrate 210. For example, as shown in FIG. 10, external signals applied through the second electrodes 140 may drive the first to fourth semiconductor light emitting devices 10a, 10b, 10c, and 10d to operate independently of each other. Accordingly, four semiconductor light emitting devices 10a, 10b, 10c, and 10d may independently operate to produce a single color. FIGS. 23A and 23B show that the wavelength conversion layers CF have their flat top surfaces, but each of the wavelength conversion layers CF may have, on a central portion thereof, a top surface at a higher level than that of a top surface on other portion thereof.

In section A of FIG. 9, a single pixel is constituted by four semiconductor light emitting devices 10a, 10b, 10c, and 10d that are arranged in a grid shape, but example embodiments are not limited thereto. In other example embodiments, as shown in section B of FIG. 9, a single pixel may be constituted by three semiconductor light emitting devices 10e, 10f, and 10g that are arranged in one direction parallel to the growth substrate 100. For example, the wavelength conversion layer CF that corresponds to a fifth semiconductor light emitting device 10e may convert an emitted light into a red light, the wavelength conversion layers CF that corresponds to a sixth semiconductor light emitting devices 10f may covert an emitted light into a green light, and the wavelength conversion layer CF that corresponds to a seventh semiconductor light emitting device 10g may convert an emitted light into a blue light. Therefore, three semiconductor light emitting devices 10e, 10f, and 10g may constitute a single RGB pixel, the first electrodes 120 of three semiconductor light emitting devices 10e, 10f, and 10g may be coupled to the vertical conductive pattern 164 serving as a common electrode, and each of the second electrodes 140 of three semiconductor light emitting devices 10e, 10f, and 10g may be coupled to a separate circuit line of the wiring substrate 210. Accordingly, three semiconductor light emitting devices 10e, 10f, and 10g may independently operate to produce a single color.

As shown in FIGS. 9, 23A, and 23B, a semiconductor light emitting device array may include a plurality of semiconductor light emitting devices. The vertical conductive pattern 164 may be provided between the plurality of semiconductor light emitting devices. The vertical conductive pattern 164 may divide the semiconductor light emitting devices from each other, and may be coupled to the extension portion 124 of the first electrode 120 of each semiconductor light emitting device to thereby apply an electrical signal to the first electrode 120. The device isolation layer 162 may be interposed between the vertical conductive pattern 164 and an outer lateral surface of the semiconductor light emitting device (or, a lateral surface of the first semiconductor layer 112, of the active layer, and of the second semiconductor layer 116), and may prevent the vertical conductive pattern 164 from being in contact with the first semiconductor layer 112, the active layer 114, and the second semiconductor layer 116.

Through the processes above, a semiconductor light emitting device array may be fabricated which includes the semiconductor light emitting device 10 of FIG. 2A.

Figure 24:
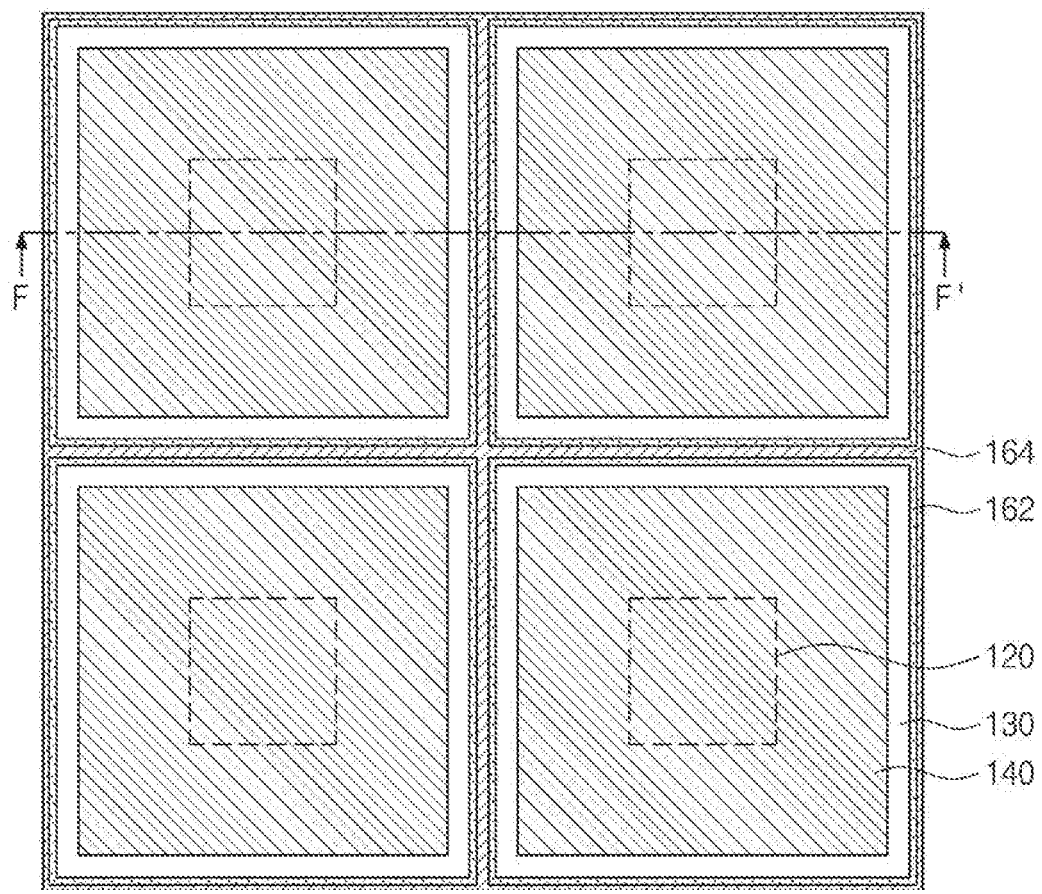
FIG. 24 illustrates a plan view showing a method of fabricating a semiconductor light emitting device array according to some example embodiments.
Figure 25:
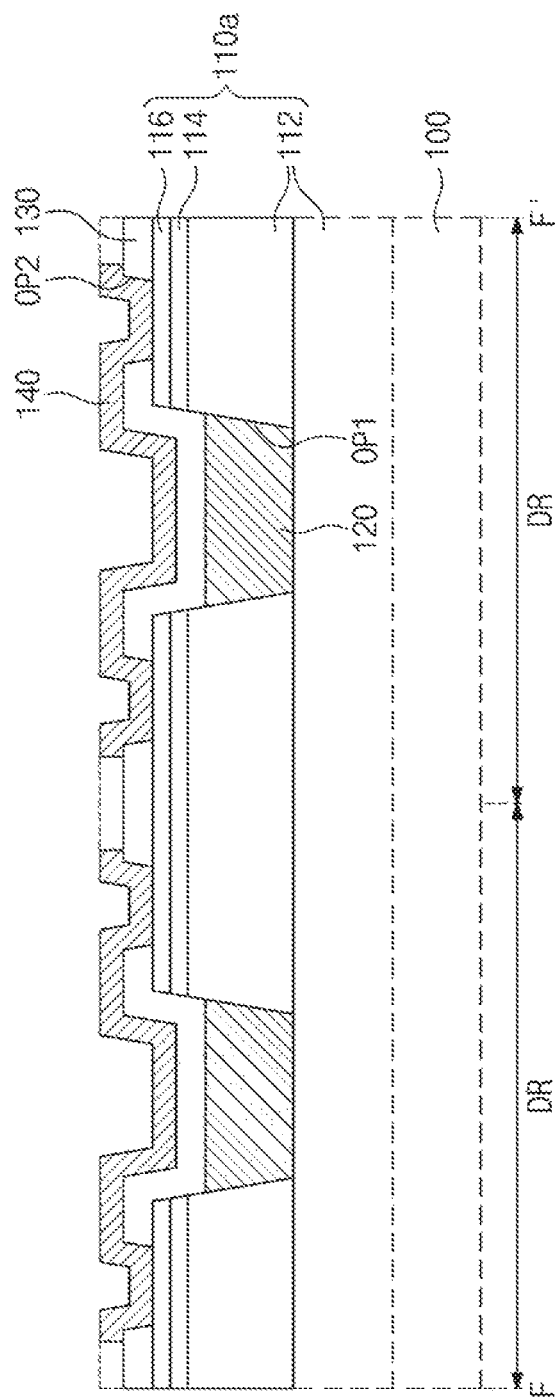
FIGS. 25 and 26 illustrate cross-sectional views showing a method of fabricating a semiconductor light emitting device array according to some example embodiments.
Figure 26:
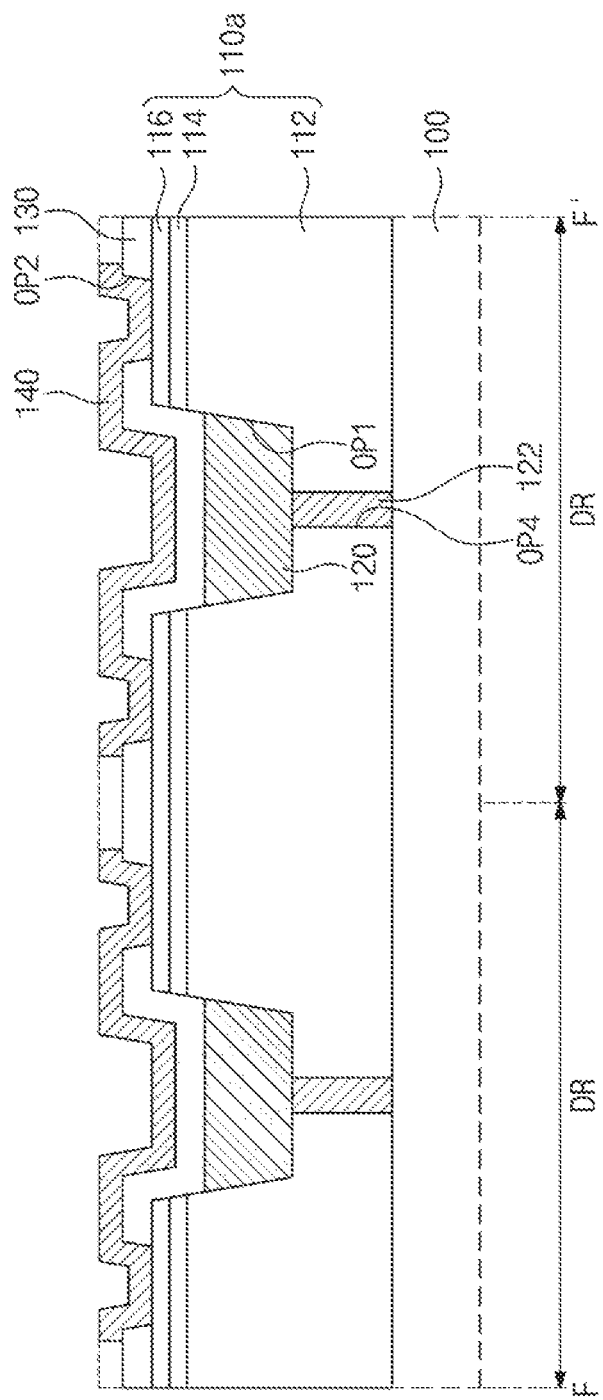

FIG. 24 illustrates a plan view showing a method of fabricating a semiconductor light emitting device array according to some example embodiments. FIGS. 25 and 26 illustrate cross-sectional views taken along line F-F' of FIG. 23, showing a method of fabricating a semiconductor light emitting device array according to some example embodiments.

The processes discussed with reference to FIGS. 11A to 16A and 11B to 16B may be performed. For example, the growth structure 110a may be formed on the growth substrate 100. The first openings OP1 may be formed on the growth structure 110a. The first openings OP1 may be formed to have only first segments OP1a formed on corresponding central portions of the device regions DR. Therefore, the first electrodes 120 may not have the extension portions 124. The first dielectric layer 130 and the second electrodes 140 may be formed on the first electrodes 120.

Referring to FIGS. 24 and 25, the growth substrate 100 may be removed to expose a bottom surface of the first semiconductor layer 112. A grinding process may be performed on the exposed bottom surface of the first semiconductor layer 112. The grinding process may continue until bottom surfaces of the first electrodes 120 are exposed. In order for electrical connection of the first electrodes 120, a wiring process may be performed on the bottom surface of the first semiconductor layer 112.

Alternatively, referring to FIGS. 24 and 26, the growth substrate 100 may be removed to expose the bottom surface of the first semiconductor layer 112. An etching process may be performed on the exposed bottom surface of the first semiconductor layer 112, thereby forming fourth openings OP4. The fourth openings OP4 may expose the bottom surfaces of the first electrodes 120. The fourth openings OP4 may be filled with a conductive material to form sub-electrodes 122. The sub-electrodes 122 may be coupled to the first electrodes 120. In order for electrical connection of the sub-electrodes 122, a wiring process may be performed on the bottom surface of the first semiconductor layer 112.

A semiconductor light emitting device according to some example embodiments may include a first electrode and a second electrode which are used to apply electrical signals to a light emitting structure, where the first and second electrodes vertically overlap each other. Accordingly, the first and second electrodes may be placed in a small area, and as a result the semiconductor light emitting device may be easily reduced in size.

Furthermore, the first electrode may be buried in a first opening of the light emitting structure, and may be in contact with top and inner lateral surfaces of a first semiconductor layer exposed to the first opening. Accordingly, an n-contact between the first electrode and the first semiconductor layer may have a large area, and electrical characteristics of the semiconductor light emitting device may be improved.

Although various example embodiments have been described and illustrated in the accompanying drawings, it will be understood by one of ordinary skill in the art that variations in form and detail may be made therein without departing from the spirit and scope of the present disclosure. The above disclosed example embodiments should thus be considered illustrative and not restrictive.

What is claimed is:

1. A semiconductor light emitting device comprising:
   a light emitting structure that includes a first semiconductor layer, an active layer, and a second semiconductor layer that are sequentially stacked, and that includes a first opening that penetrates the second semiconductor layer and the active layer, the first opening exposing the first semiconductor layer;
   a first electrode that fills at least a portion of the first opening;
   a first dielectric layer on the first electrode and filling an upper portion of the first opening;
   a second electrode on the light emitting structure and covering the first dielectric layer, the second electrode being electrically connected to the second semiconductor layer; and
   a vertical conductive pattern that surrounds outer lateral surfaces of the light emitting structure and is electrically connected to the first electrode,
   wherein a lateral surface of the first electrode is in contact with a portion of the first semiconductor layer that is exposed by the first opening.

2. The semiconductor light emitting device of claim 1, wherein
   the second electrode vertically overlaps the first electrode, and
   a planar shape of the second electrode is greater than a planar shape of the first electrode.

3. The semiconductor light emitting device of claim 1, wherein the first dielectric layer is in the first opening and covers a lateral surface of the active layer, the lateral surface of the active layer being exposed by an inner lateral surface of the first opening.

4. The semiconductor light emitting device of claim 1, wherein the light emitting structure further includes a recess that penetrates the second semiconductor layer and the active layer, the recess exposing the first semiconductor layer,
   wherein a depth of the recess from a top surface of the second semiconductor layer is less than a depth of the first opening from the top surface of the second semiconductor layer, and
   wherein, when viewed in plan, the first opening penetrates a central portion of the recess.

5. The semiconductor light emitting device of claim 4, wherein the top surface of the first electrode is at a level higher than a level of a bottom surface of the second semiconductor layer, and
   in the recess, the lateral surface of the first electrode is spaced apart from the second semiconductor layer.

6. The semiconductor light emitting device of claim 1, wherein a distance from an inner lateral surface of the first opening to an outer lateral surface of the light emitting structure is about 1 μm to about 100 μm.

7. The semiconductor light emitting device of claim 1, further comprising a device isolation layer between the vertical conductive pattern and the outer lateral surfaces of the light emitting structure, the device isolation layer surrounding the light emitting structure.

8. A semiconductor light emitting device comprising:
   a light emitting structure that includes a first semiconductor layer, an active layer, and a second semiconductor layer that are sequentially stacked, and that includes a first opening that penetrates the second semiconductor layer and the active layer, the first opening exposing the first semiconductor layer;
   a first electrode that fills at least a portion of the first opening;
   a first dielectric layer on the first electrode and filling an upper portion of the first opening;

a second electrode on the light emitting structure and covering the first dielectric layer, the second electrode being electrically connected to the second semiconductor layer; and a vertical conductive pattern that surrounds outer lateral surfaces of the light emitting structure and is electrically connected to the first electrode, wherein a top surface of the first electrode is at a level lower than a level of a bottom surface of the second semiconductor layer.

9. A semiconductor light emitting device comprising:

a light emitting structure that includes a first semiconductor layer, an active layer, and a second semiconductor layer that are sequentially stacked, and that includes a first opening that penetrates the second semiconductor layer and the active layer, the first opening exposing the first semiconductor layer;

a first electrode that fills at least a portion of the first opening;

a first dielectric layer on the first electrode;

a second electrode on the light emitting structure and covering the first dielectric layer, the second electrode being electrically connected to the second semiconductor layer; and a vertical conductive pattern that surrounds outer lateral surfaces of the light emitting structure and is electrically connected to the first electrode, wherein the first electrode includes an extension portion in contact with the vertical conductive pattern, the extension portion horizontally penetrating the first semiconductor layer and extending toward an outer lateral surface of the light emitting structure, wherein the extension portion is spaced apart from the active layer.

10. The semiconductor light emitting device of claim 9, wherein the first dielectric layer extends onto a top surface of the extension portion.

11. A semiconductor light emitting device comprising:

a light emitting structure that includes a first semiconductor layer, an active layer, and a second semiconductor layer that are sequentially stacked;

a first opening that penetrates the second semiconductor layer and the active layer, the first opening exposing the first semiconductor layer;

a first electrode that fills a lower portion of the first opening to cover the first semiconductor layer exposed by the first opening and contacts the first semiconductor layer exposed by the first opening;

a second electrode that covers the second semiconductor layer and the first electrode; and a first dielectric layer between the first electrode and the second electrode.

12. The semiconductor light emitting device of claim 11, wherein the first electrode is below a central portion of the second electrode.

13. The semiconductor light emitting device of claim 12, wherein, when viewed in plan, lateral surfaces of the first electrode are spaced toward the central portion of the second electrode from lateral surfaces of the second electrode.

14. The semiconductor light emitting device of claim 11, wherein the lower portion of the first opening is at a level lower than a level of the active layer and the first opening has an upper portion on the lower portion.

15. The semiconductor light emitting device of claim 14, wherein the first dielectric layer fills the upper portion of the first opening.

16. The semiconductor light emitting device of claim 14, wherein a width of the upper portion of the first opening is greater than a width of the lower portion of the first opening.

17. The semiconductor light emitting device of claim 11, wherein the first electrode vertically penetrates the first semiconductor layer and is exposed on a bottom surface of the first semiconductor layer.

18. The semiconductor light emitting device of claim 11, wherein a portion of the first electrode extends to and is exposed on an outer lateral surface of the light emitting structure, wherein the portion of the first electrode is at a level lower than a level of a bottom surface of the active layer.

19. The semiconductor light emitting device of claim 11, further comprising:

a device isolation layer that surrounds the light emitting structure and covers outer lateral surfaces of the light emitting structure; and a conductive pattern that surrounds the light emitting structure and is spaced apart from the light emitting structure across the device isolation layer.

* * * * *